US009823071B2

(12) United States Patent
Aoki

(10) Patent No.: US 9,823,071 B2
(45) Date of Patent: Nov. 21, 2017

(54) PACKAGE, ELECTRONIC COMPONENT MOUNTED PACKAGE, PHYSICAL QUANTITY SENSOR, ELECTRONIC DEVICE, AND MOVING OBJECT

(71) Applicant: Seiko Epson Corporation, Tokyo (JP)

(72) Inventor: Shinya Aoki, Minowa (JP)

(73) Assignee: Seiko Epson Corporation (JP)

( * ) Notice: Subject to any disclaimer, the term of this patent is extended or adjusted under 35 U.S.C. 154(b) by 284 days.

(21) Appl. No.: 14/551,610

(22) Filed: Nov. 24, 2014

(65) Prior Publication Data
US 2015/0143903 A1 May 28, 2015

(30) Foreign Application Priority Data
Nov. 25, 2013 (JP) .................................. 2013-242556

(51) Int. Cl.
*G01C 19/5628* (2012.01)

(52) U.S. Cl.
CPC ................ *G01C 19/5628* (2013.01); *H01L 2224/05554* (2013.01); *H01L 2224/49175* (2013.01)

(58) Field of Classification Search
CPC ............. G01C 19/5628; G01C 19/56; H01L 2224/05554; H01L 2224/49175; H01L 41/047; H01L 41/22; G06F 15/00; G01P 15/00
USPC ...................................................... 73/504.12
See application file for complete search history.

(56) References Cited

U.S. PATENT DOCUMENTS

| | | | |
|---|---|---|---|
| 5,869,852 A | 2/1999 | Kinoshita | |
| 7,968,958 B2* | 6/2011 | Fujii | B81B 7/007 257/415 |
| 2006/0053908 A1* | 3/2006 | Ishigami | B60C 23/0408 73/866.1 |
| 2008/0030205 A1* | 2/2008 | Fujii | B81B 7/02 324/661 |
| 2011/0018113 A1* | 1/2011 | Huang | B81B 7/0077 257/684 |
| 2011/0174073 A1* | 7/2011 | Oguri | G01C 19/5607 73/504.12 |
| 2012/0000288 A1* | 1/2012 | Matsuura | G01L 1/183 73/579 |
| 2012/0109574 A1* | 5/2012 | Manolescu | G01P 15/0891 702/141 |

(Continued)

FOREIGN PATENT DOCUMENTS

| | | |
|---|---|---|
| JP | 10-284605 A | 10/1998 |
| JP | 2005-182572 A | 7/2005 |
| JP | 2005-241380 A | 9/2005 |

(Continued)

*Primary Examiner* — Lisa Caputo
*Assistant Examiner* — Nathaniel T Woodward
(74) *Attorney, Agent, or Firm* — Harness, Dickey & Pierce, P.L.C.

(57) ABSTRACT

A physical quantity sensor includes a base on which an IC electrically connected to a gyro element is arranged and a wire group arranged on the base. The base includes a first outer edge and a second outer edge that crosses the first outer edge. The wire group includes a CLK wire arranged along the first outer edge and including an internal terminal connected to the IC and an S1 wire arranged along the second outer edge and including an internal terminal connected to the IC. A detection signal of the gyro element is input to the IC via the S1 wire.

15 Claims, 17 Drawing Sheets

(56) References Cited

U.S. PATENT DOCUMENTS

2012/0223622 A1* 9/2012 Otsuki .................... H03H 9/02
310/344

FOREIGN PATENT DOCUMENTS

| JP | 2008-197033 A | 8/2008 |
| JP | 2012-098033 A | 5/2012 |

* cited by examiner

PACKAGE, ELECTRONIC COMPONENT MOUNTED PACKAGE, PHYSICAL QUANTITY SENSOR, ELECTRONIC DEVICE, AND MOVING OBJECT

BACKGROUND

1. Technical Field

The present invention relates to a package, an electronic component mounted package, a physical quantity sensor, an electronic device, and a moving object.

2. Related Art

An angular velocity sensor described in JP-A-2008-197033 (Patent Literature 1) has been known as a physical quantity sensor for detecting a physical quantity such as angular velocity.

The angular velocity sensor described in Patent Literature 1 includes a package and a gyro element and an IC housed in the package. A plurality of wires are formed on the package (a base). Predetermined terminals of the IC are electrically connected to the gyro element and drawn out to the outside via the wires. More specifically, the plurality of wires include at least a first detection wire electrically connected to a first detection element included in the gyro element, a second detection wire electrically connected to a second detection terminal included in the gyro element, and an input and output wire from which a signal is input to the IC and to which a signal is output from the IC.

In recent years, a digital interface is used more often than ever as means for inputting and outputting signals between the IC and the outside. When the digital interface is used, the plurality of wires include the input and output wire from which a digital signal is input to the IC and to which a digital signal is output from the IC. Therefore, in some case, noise is mixed in the first and second detection wires and detection signals cannot be accurately acquired because of electric connection between the first and second detection wires (first and second detection signal input pads) and the input and output wire (an input and output pad).

SUMMARY

An advantage of some aspects of the invention is to provide a package, an electronic component mounted package, a physical quantity sensor, an electronic device, and a moving object that can reduce noise interference.

The invention can be implemented as the following application examples.

APPLICATION EXAMPLE 1

A package according to this application example includes: a base on which an electronic component is arranged; and a plurality of wires arranged on the base. The wires include: a plurality of first wires including internal terminals connected to the electronic component; and a plurality of second wires including internal terminals connected to the electronic component. The internal terminals of the plurality of first wires are arranged side by side along a first axis. The internal terminals of the plurality of second wires are arranged side by side along a second axis that crosses the first axis. The plurality of second wires include a detection signal wire electrically connected to a detection electrode of a physical quantity detection element. The plurality of first wires include a digital signal wire for transmitting a digital signal. An internal terminal of the digital signal wire is arranged on the opposite side of the second axis with respect to a center line in the first axis direction in the plurality of internal terminals of the plurality of first wires.

With this configuration, the first wires and the second wires can be separated from each other. Therefore, it is possible to reduce noise interference from the first wires to the second wires.

APPLICATION EXAMPLE 2

A package according to this application example includes: a base on which an electronic component is arranged; and wires arranged on the base. The base includes, in a plan view of the base, a first outer edge and a second outer edge located on one end side of the first outer edge and extending in a direction that crosses the first outer edge. The wires include: a first wire including an internal terminal connected to the electronic component and a side surface electrode arranged on a side surface corresponding to the first outer edge of the base; and a plurality of second wires arranged side by side along an axis parallel to the second outer edge and including internal terminals connected to the electronic component. The first wire includes a digital signal wire for transmitting a digital signal. The second wires include a detection signal wire electrically connected to a detection electrode of a physical quantity detection element.

With this configuration, the first wire and the second wires can be separated from each other. Therefore, it is possible to reduce noise interference from the first wires to the second wires.

APPLICATION EXAMPLE 3

In the package according to the application example described above, it is preferable that a plurality of the first wires are provided, and the internal terminals of the first wires are arranged side by side along an axis parallel to the first outer edge.

With this configuration, the internal terminals of the first wires and the internal terminals of the second wires can be separated from each other. Therefore, it is possible to reduce noise interference from the first wires to the second wires.

APPLICATION EXAMPLE 4

In the package according to the application example described above, it is preferable that at least one of a ground wire and a fixed potential wire having fixed potential is arranged between the internal terminal of the digital signal wire and the internal terminal of the detection signal wire.

With this configuration, the ground wire or the fixed potential wire functions as a shield layer. Therefore, it is possible to further reduce the noise interference from the first wires to the second wires.

APPLICATION EXAMPLE 5

A package according to this application example includes: a base on which an electronic component is arranged; and a plurality of wires arranged on the base. The plurality of wires include: a plurality of first wires including internal terminals connected to the electronic component; and a second wire including an internal terminal connected to the electronic component. The plurality of first wires include a digital signal wire for transmitting a digital signal. The second wire includes a detection signal wire electrically connected to a detection electrode of a physical quantity detection element. A ground wire or a fixed potential wire having fixed potential is arranged between the digital signal wire and the detection signal wire.

With this configuration, the ground wire or the fixed potential wire functions as a shield layer. Therefore, it is possible to further reduce noise interference from the first wires to the second wire.

APPLICATION EXAMPLE 6

In the package according to the application example described above, it is preferable that the base includes, in a plan view of the base, a first outer edge and a second outer edge located on one end side of the first outer edge and extending in a direction that crosses the first outer edge, the internal terminals of the plurality of first wires are arranged along a first axis parallel to the first outer edge, a plurality of the second wires are provided, and the internal terminals of the plurality of second wires are arranged along a second axis parallel to the second outer edge.

With this configuration, the first wires and the second wires can be separated from each other. Therefore, it is possible to further reduce the noise interference from the first wires to the second wires.

APPLICATION EXAMPLE 7

In the package according to the application example described above, it is preferable that the internal terminal of the digital signal wire is arranged on the other end side of the first outer edge.

With this configuration, the first wires and the second wire can be further separated from each other. Therefore, it is possible to further reduce the noise interference from the first wires to the second wire.

APPLICATION EXAMPLE 8

An electronic component mounted package according to this application example includes: the package according to the application example described above; and an electronic component.

With this configuration, it is possible to obtain the electronic component mounted package having high reliability.

APPLICATION EXAMPLE 9

An electronic component mounted package according to this application example includes: a base; an electronic component arranged on the base; a first wire connected to the electronic component; a second wire connected to the electronic component; a first conductive wire that connects the electronic component and the first wire; and a second conductive wire that connects the electronic component and the second wire. The first wire includes a digital signal wire for transmitting a digital signal. The second wire includes a detection signal wire electrically connected to a detection electrode of a physical quantity detection element. In a plan view of the base, an extending direction of the first conductive wire connected to the digital signal wire and an extending direction of the second conductive wire connected to the detection signal wire cross each other.

With this configuration, the first conductive wire and the second conductive wire can be separated from each other. Therefore, it is possible to reduce noise interference from the first wire to the second wire.

APPLICATION EXAMPLE 10

In the electronic component mounted package according to the application example described above, it is preferable that, in the plan view of the base, the extending direction of the first conductive wire connected to the digital signal wire and the extending direction of the second conductive wire connected to the detection signal wire are orthogonal to each other.

APPLICATION EXAMPLE 11

A physical quantity sensor according to this application example includes: the electronic component mounted package according to the application example described above; and a physical quantity detection element.

With this configuration, it is possible to obtain the electronic component mounted package having high reliability.

APPLICATION EXAMPLE 12

An electronic device according to this application example includes the physical quantity sensor according to the application example described above.

With this configuration, it is possible to obtain the electronic device having high reliability.

APPLICATION EXAMPLE 13

A moving object according to this application example includes the physical quantity sensor according to the application example described above.

With this configuration, it is possible to obtain the moving object having high reliability.

BRIEF DESCRIPTION OF THE DRAWINGS

The invention will be described with reference to the accompanying drawings, wherein like numbers reference like elements.

DESCRIPTION OF EXEMPLARY EMBODIMENTS

A package, an electronic component mounted package, a physical quantity sensor, an electronic device and a moving object of the invention are explained in detail below with reference to embodiments illustrated in the accompanying drawings.

First Embodiment

1. Physical Quantity Sensor

Figure 1:
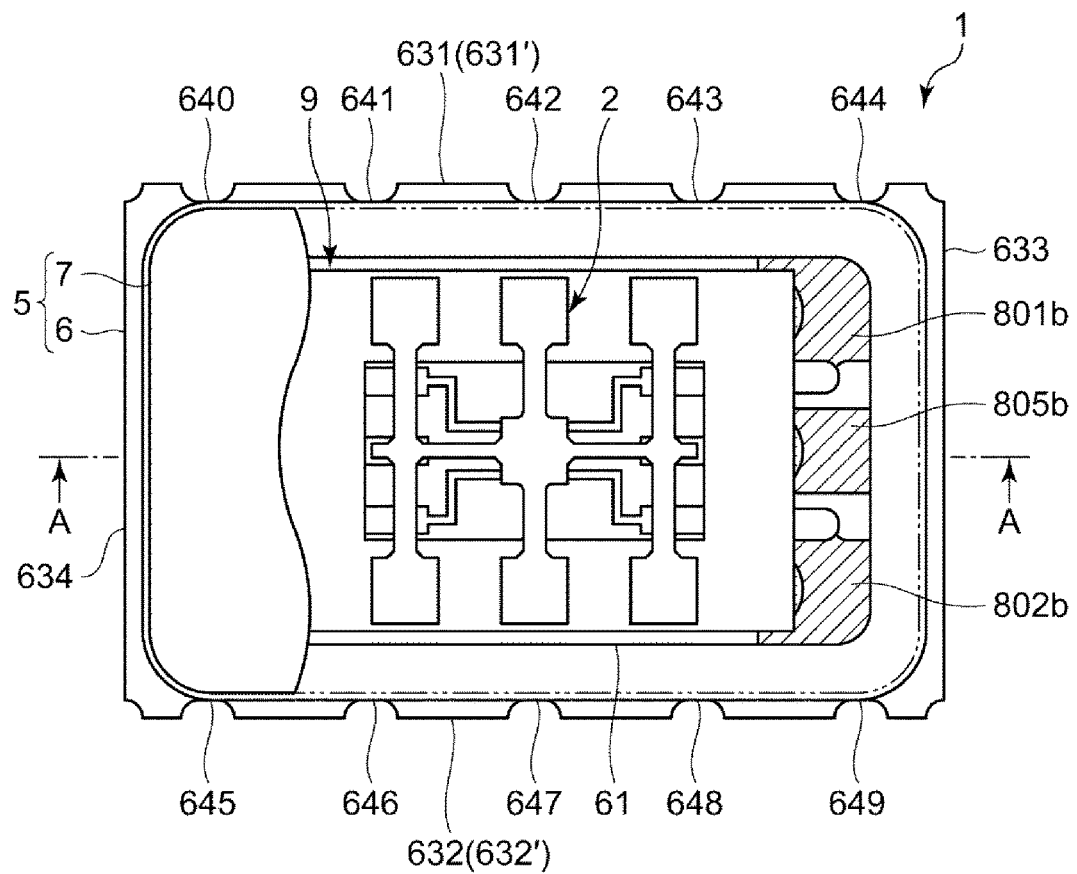
FIG. 1 is a plan view (a top view) of a physical quantity sensor according to a first embodiment of the invention.
Figure 2:
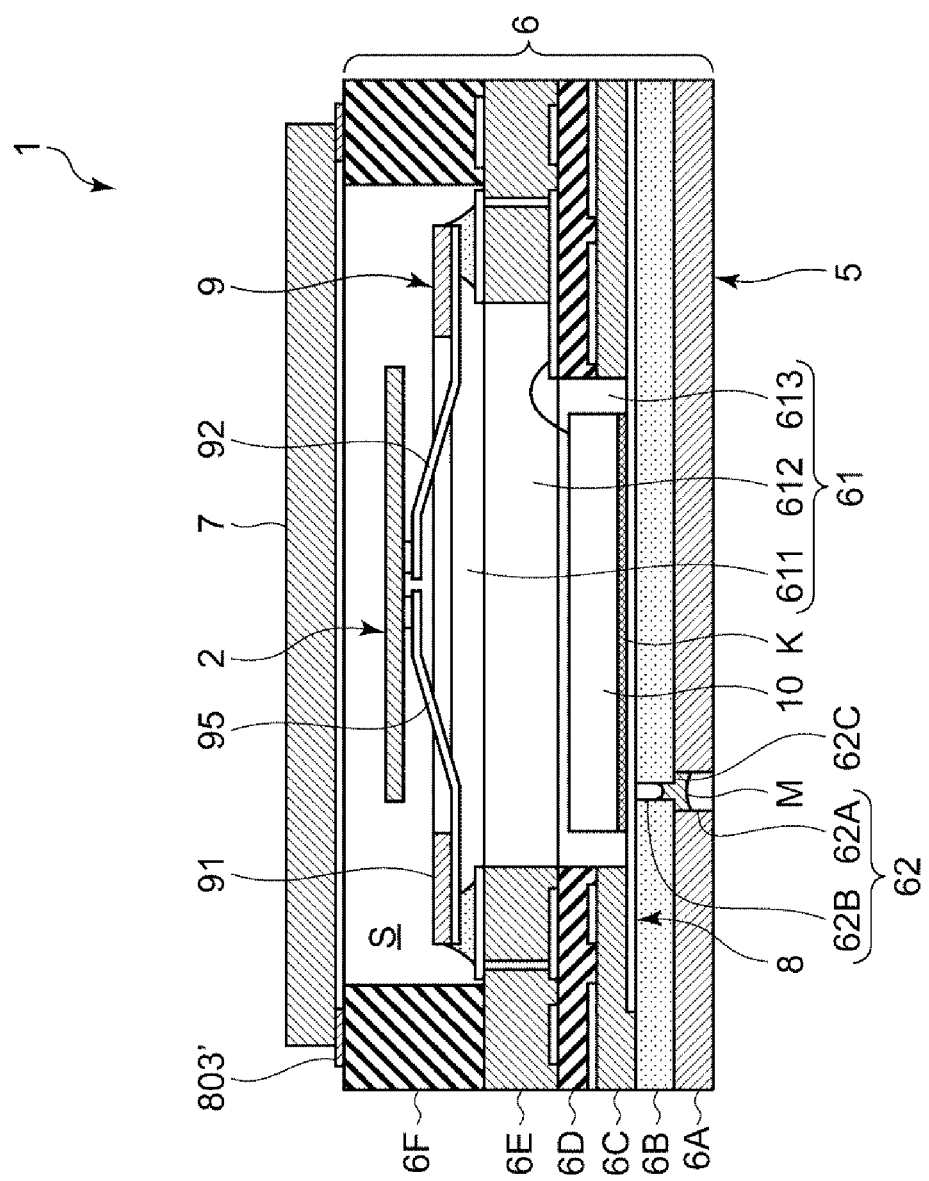
FIG. 2 is a sectional view taken along line A-A in FIG. 1.
Figure 3:
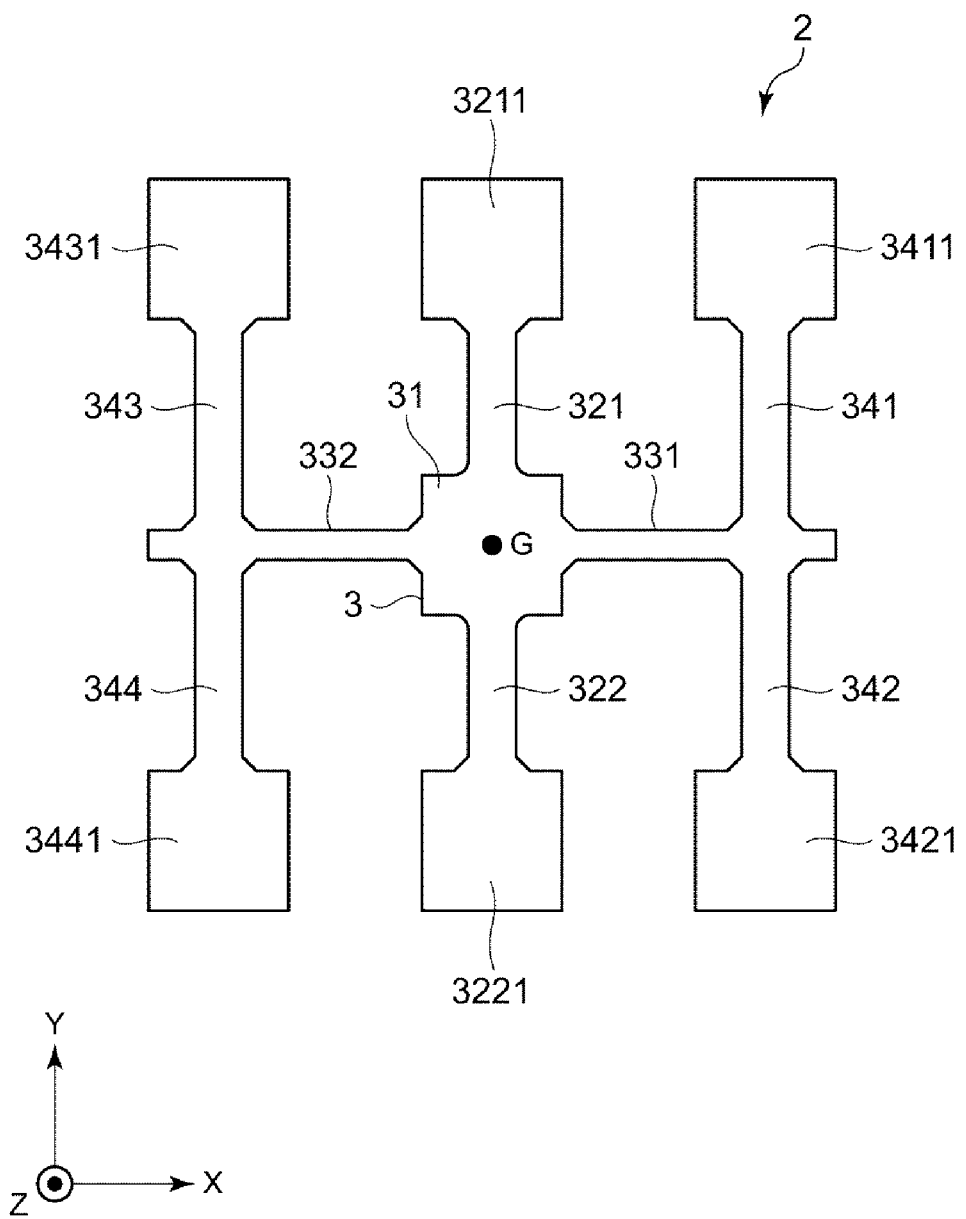
FIG. 3 is a plan view (a top view) showing a gyro element included in the physical quantity sensor shown in FIG. 1.
Figure 4:
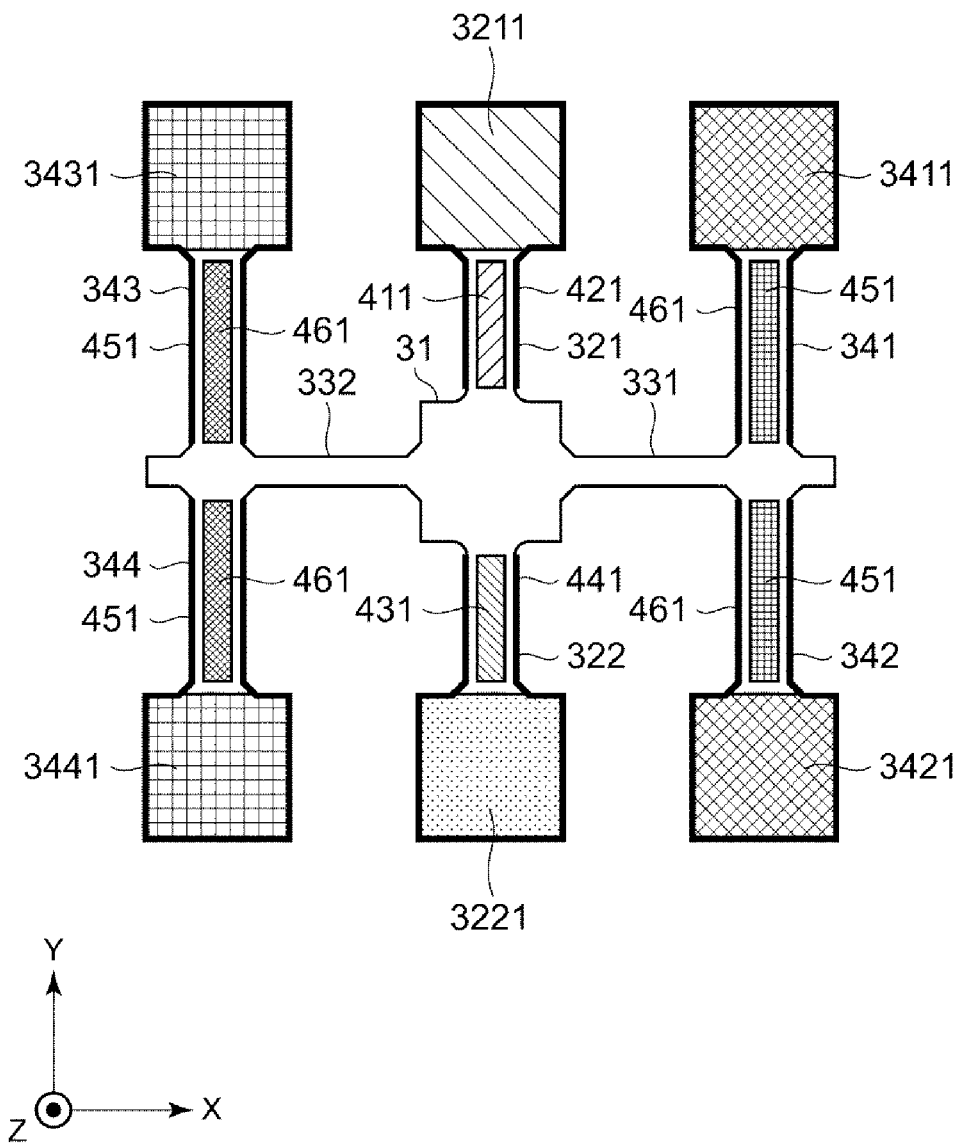
FIG. 4 is a plan view (a top view) showing electrode arrangement of the gyro element shown in FIG. 3.
Figure 5:
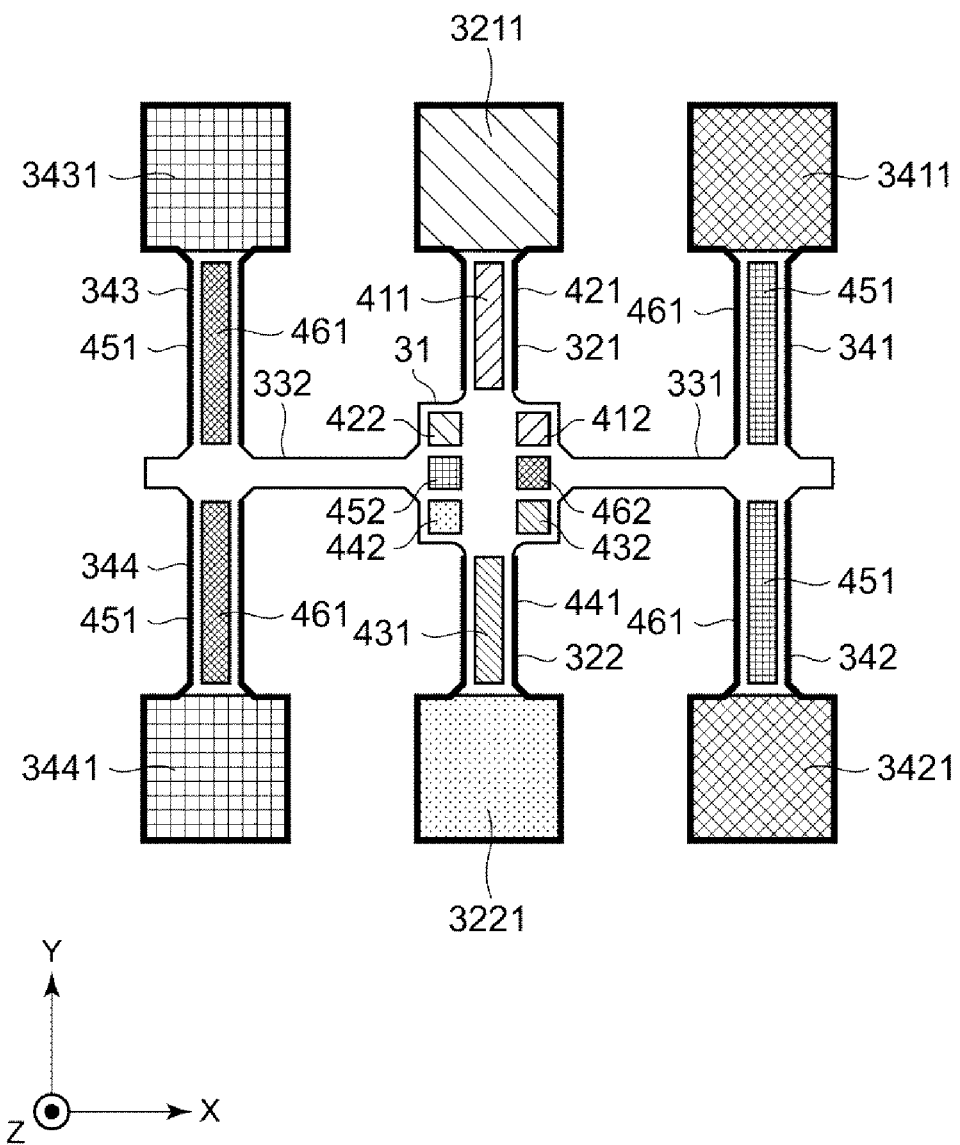
FIG. 5 is a plan view (a top transparent view) showing the electrode arrangement of the gyro element shown in FIG. 3.
Figure 6A:
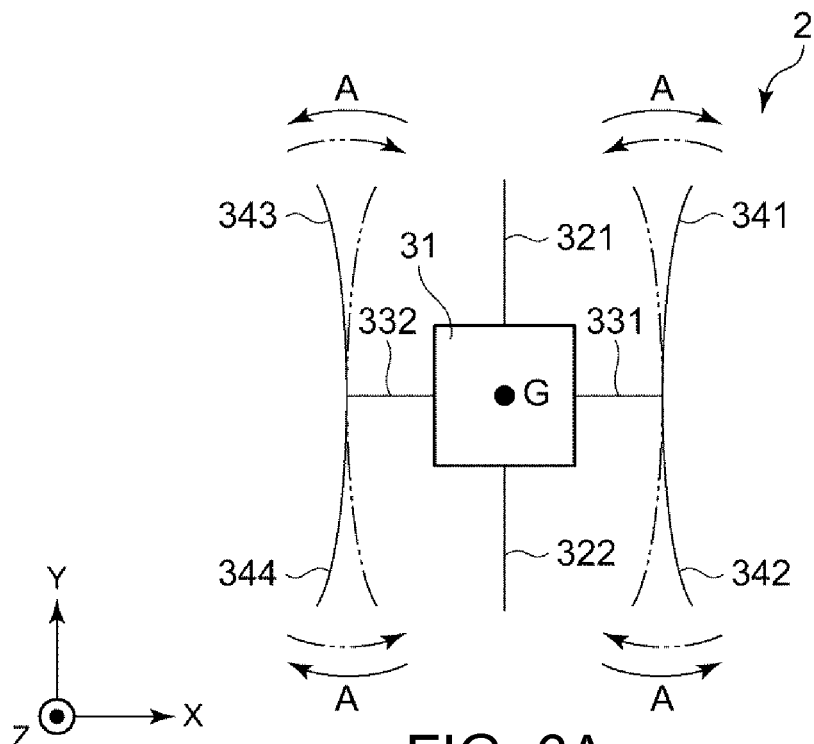
FIGS. 6A and 6B are diagrams for explaining the operation of the gyro element shown in FIG. 3.
Figure 6B:
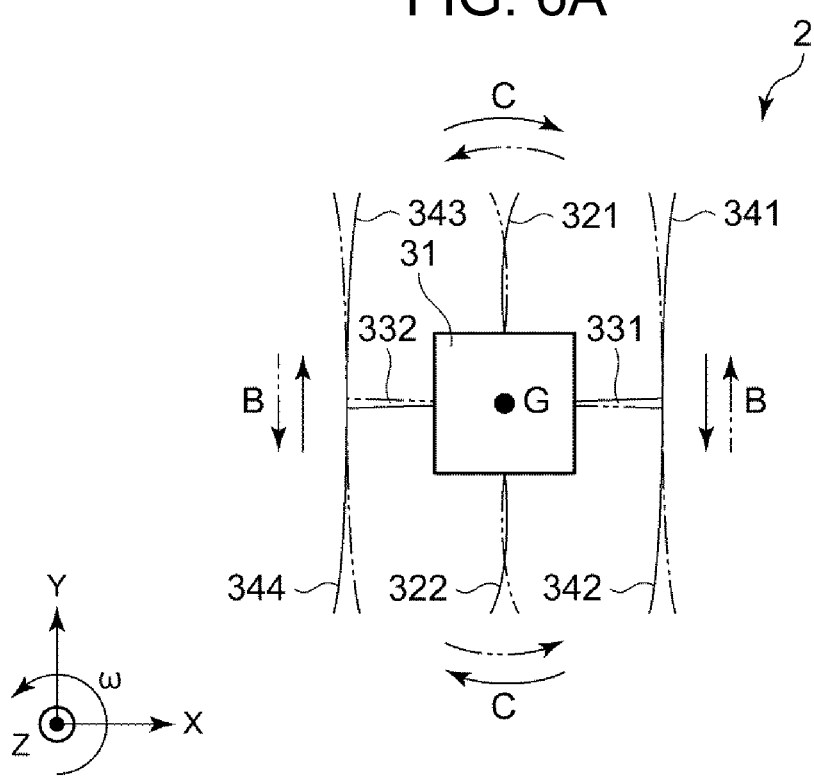
Figure 7A:
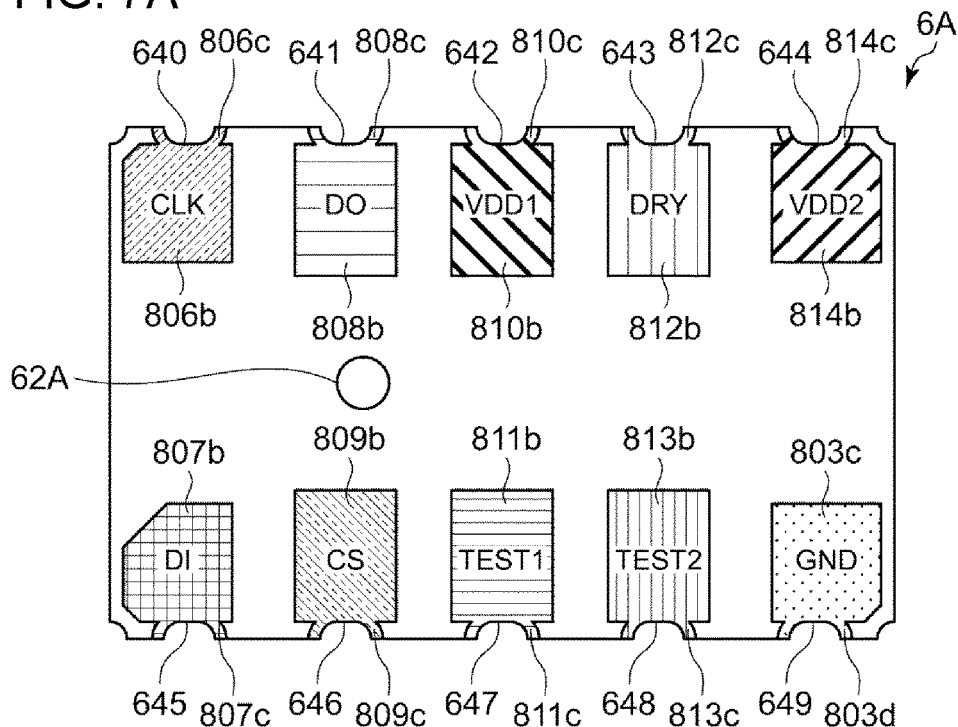
FIG. 7A is a plan view (a top transparent view) of a first substrate.
Figure 7B:
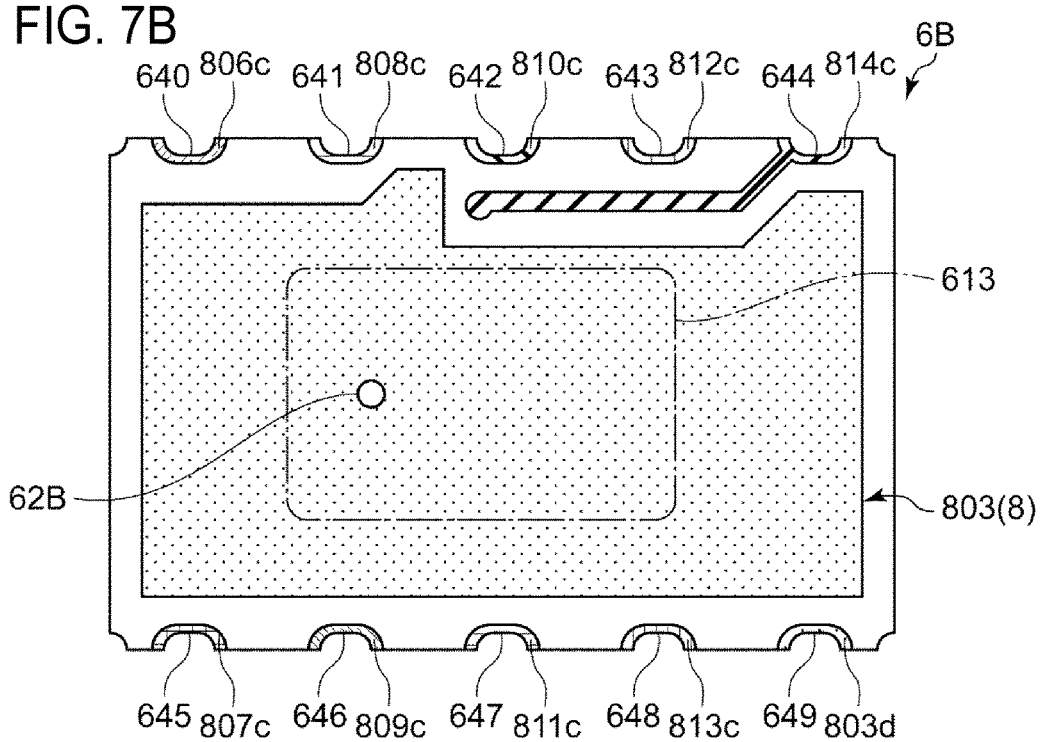
FIG. 7B is a plan view (a top view) of a second substrate.
Figure 8A:
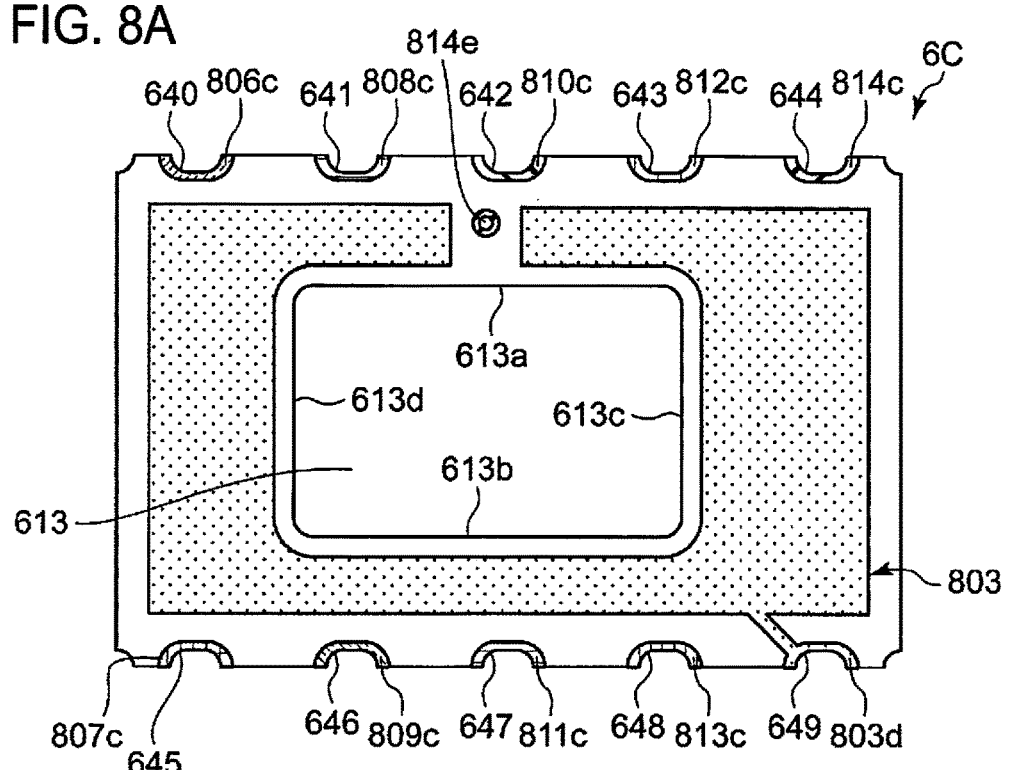
FIG. 8A is a plan view (a top view) of a third substrate.
Figure 8B:
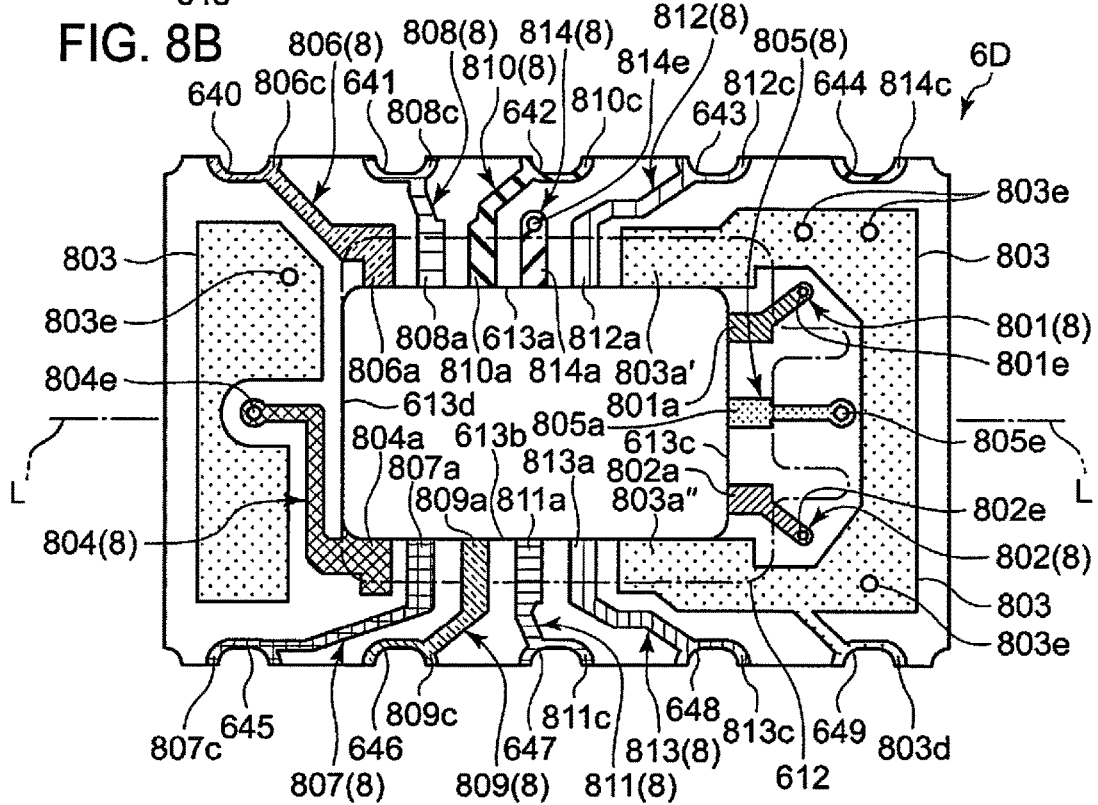
FIG. 8B is a plan view (a top view) of a fourth substrate.
Figure 9A:
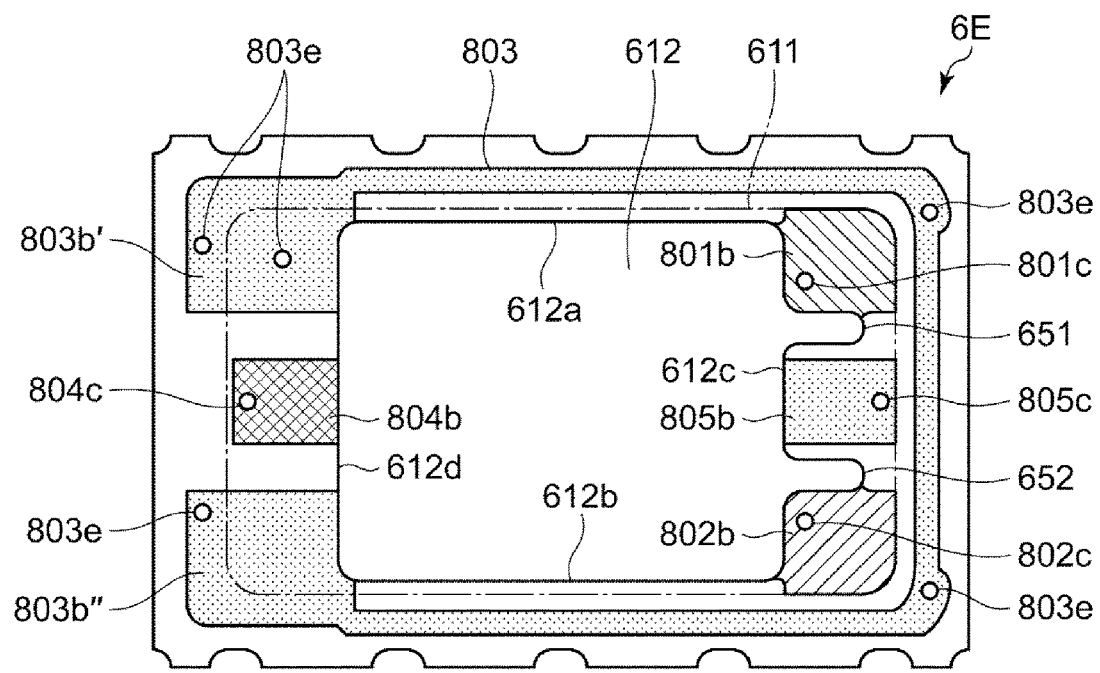
FIG. 9A is a plan view (a top view) of a fifth substrate.
Figure 9B:
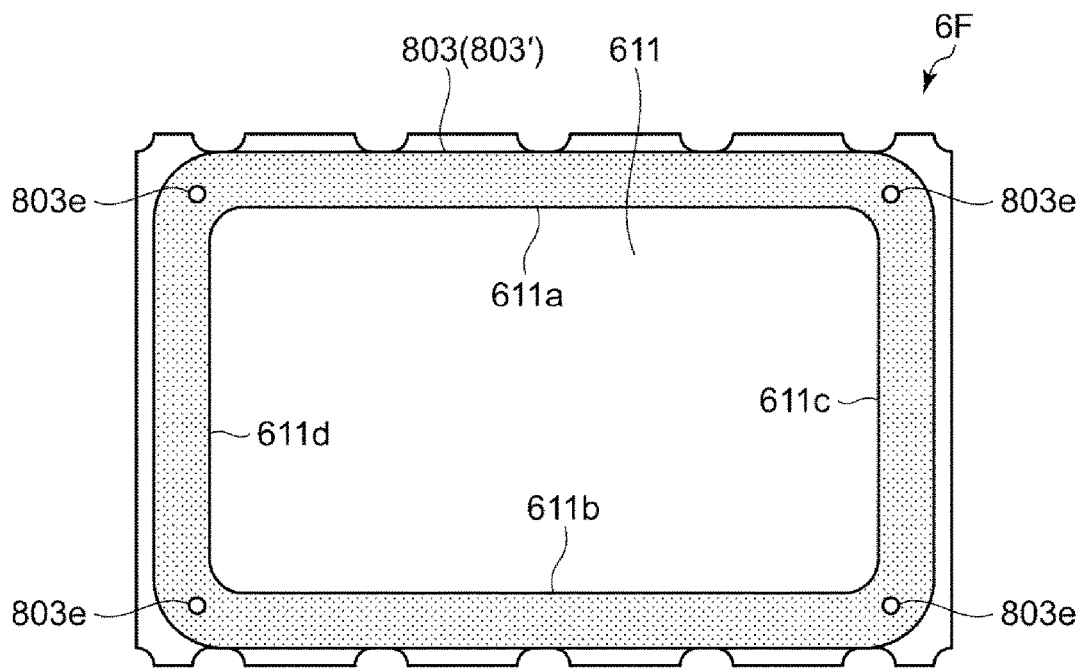
FIG. 9B is a plan view (a top view) of a sixth substrate.
Figure 10:
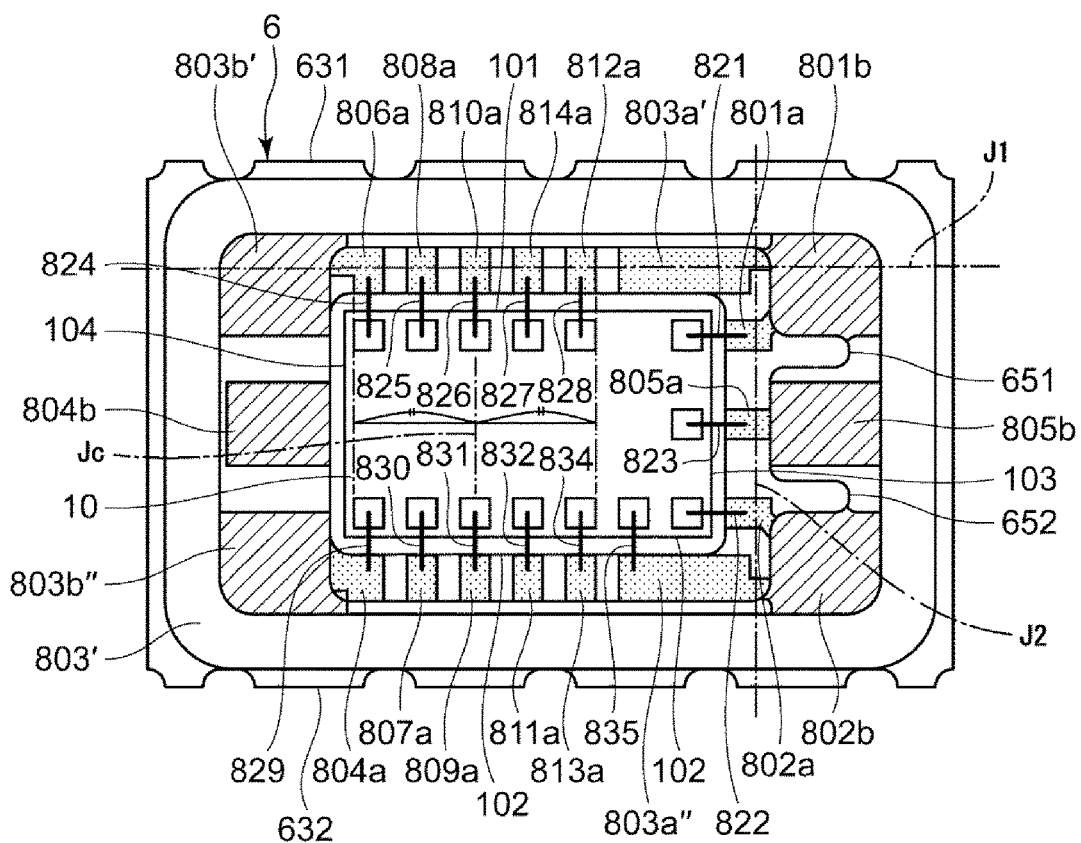
FIG. 10 is a plan view (a top view) of a base.
Figure 11:
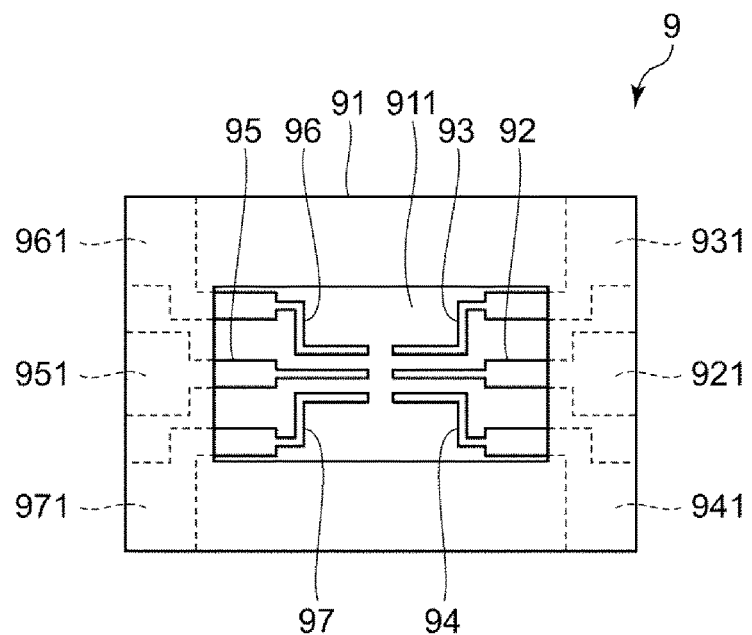
FIG. 11 is a plan view (a top view) of a supporting substrate included in a vibrating piece shown in FIG. 1.
Figure 12:
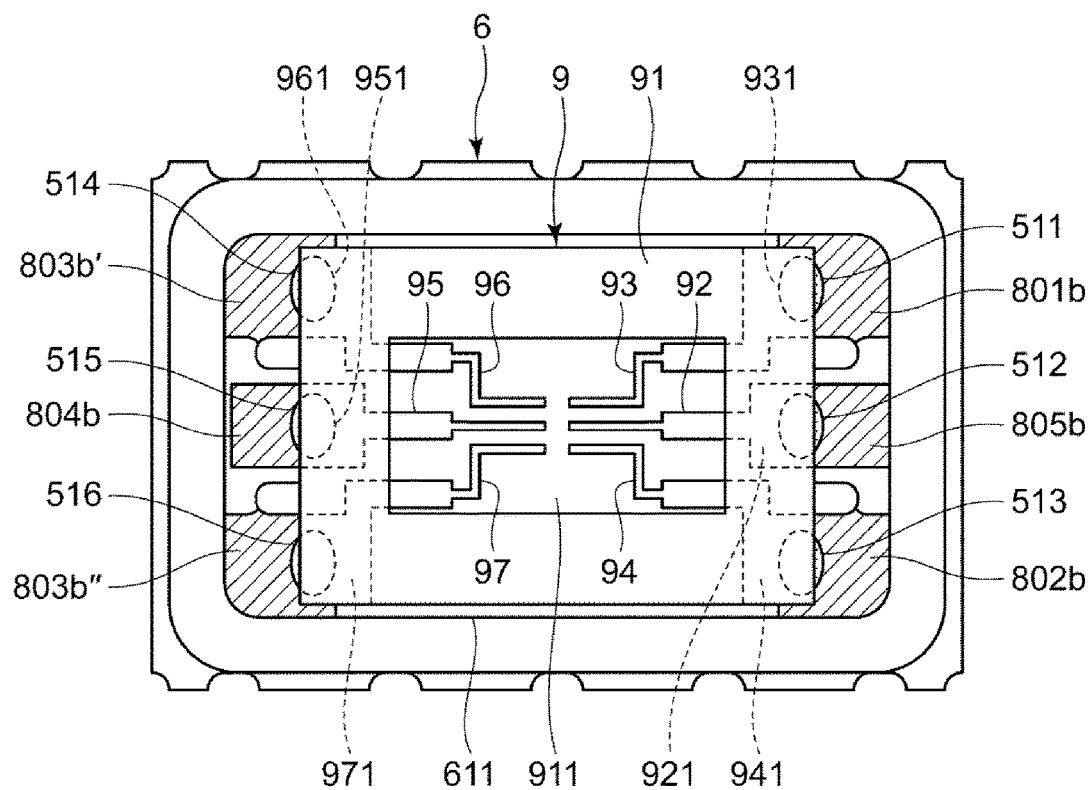
FIG. 12 is a plan view (a top view) showing a joined state of the supporting substrate and the base.
Figure 13:
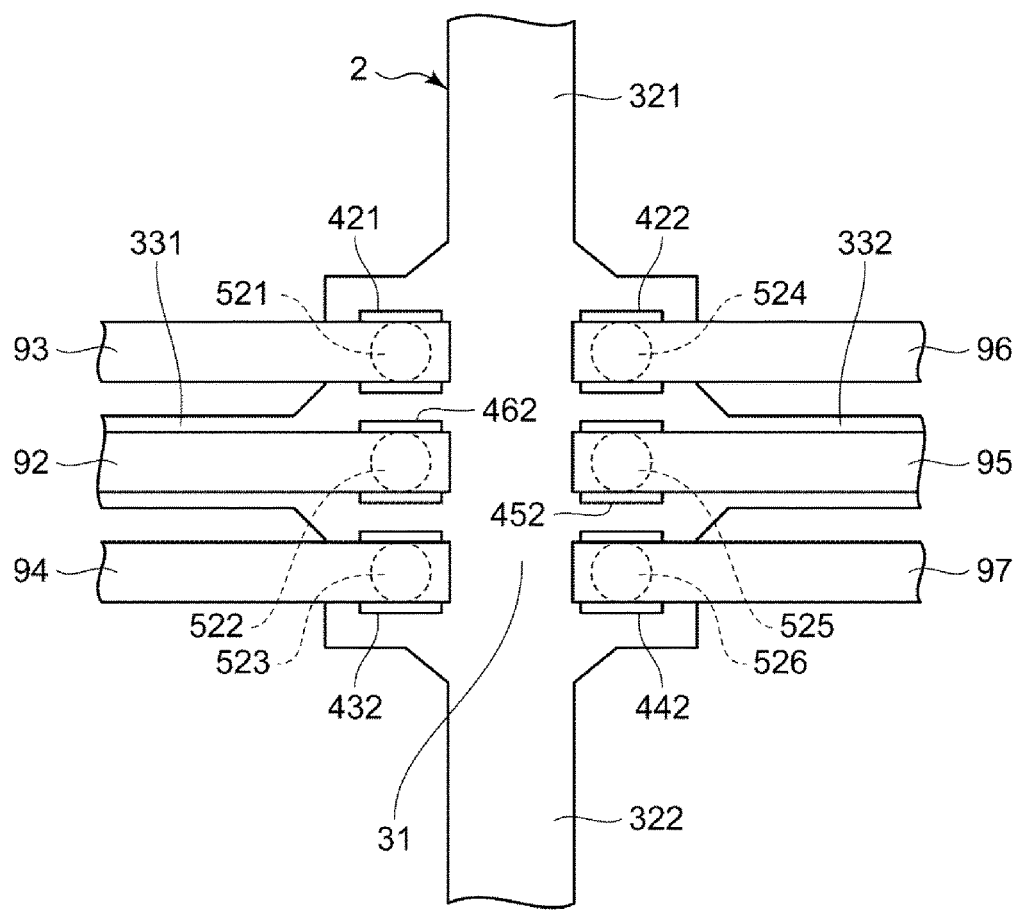
FIG. 13 is a plan view (a bottom view) showing a joined state of the supporting substrate and the gyro element.

FIG. 1 is a plan view (a top view) of a physical quantity sensor according to a first embodiment of the invention. FIG. 2 is a sectional view taken along line A-A in FIG. 1. FIG. 3 is a plan view (a top view) showing a gyro element included in the physical quantity sensor shown in FIG. 1. FIG. 4 is a plan view (a top view) showing electrode arrangement of the gyro element shown in FIG. 3. FIG. 5 is a plan view (a top transparent view) showing the electrode arrangement of the gyro element shown in FIG. 3. FIGS. 6A and 6B are diagrams for explaining the operation of the gyro element shown in FIG. 3. FIG. 7A is a plan view (a top transparent view) of a first substrate. FIG. 7B is a plan view (a top view) of a second substrate. FIG. 8A is a plan view (a top view) of a third substrate. FIG. 8B is a plan view (a top view) of a fourth substrate. FIG. 9A is a plan view (a top view) of a fifth substrate. FIG. 9B is a plan view (a top view) of a sixth substrate. FIG. 10 is a plan view (a top view) of a base. FIG. 11 is a plan view (a top view) of a supporting substrate included in a vibrating piece shown in FIG. 1. FIG. 12 is a plan view (a top view) showing a joined state of the supporting substrate and the base. FIG. 13 is a plan view (a bottom view) showing a joined state of the supporting substrate and the gyro element. In the following explanation, for convenience of explanation, the paper surface front side in FIG. 1 and the upper side in FIG. 2 are also referred to as "upper" and the paper surface depth side in FIG. 1 and the lower side in FIG. 2 is also referred to as "lower". In the following explanation, a direction along an X axis is also referred to as "X-axis direction and a direction along a Y axis is also referred to as "Y-axis direction".

A physical quantity sensor 1 shown in FIGS. 1 and 2 is a gyro sensor. The physical quantity sensor 1 includes a gyro element (a physical quantity detection element) 2, a package 5 that houses the gyro element 2, a supporting substrate 9 that supports the gyro element 2 and is fixed to the package 5, and an IC (an electronic component) 10 arranged in the package 5. Note that the package 5 mounted with the IC 10 is an electronic component mounted package.

These components are explained below in order.

Gyro Element

As shown in FIG. 3, the gyro element 2 includes a vibrating piece 3 and an electrode formed in the vibrating piece 3.

Vibrating Piece

Examples of a constituent material of the vibrating piece 3 include piezoelectric materials such as quartz, lithium tantalate, and lithium niobate. Among these materials, it is preferable to use quartz as the constituent material of the vibrating piece 3. By using quartz, the gyro element 2 having an excellent frequency temperature characteristic compared with the other materials is obtained. Note that, in the following explanation, the vibrating piece 3 is formed of quartz.

The vibrating piece 3 is formed in a tabular shape having a spread on an XY plane defined by a Y axis (a mechanical axis) and an X axis (an electric axis), which are crystal axes of a quartz substrate, and having thickness in a Z axis (an optical axis) direction. That is, the vibrating piece 3 is formed by a Z-cut quartz plate. Note that the Z axis preferably coincides with the thickness direction of the vibrating piece 3. However, from the viewpoint of reducing a frequency temperature change in the vicinity of the normal temperature, the Z axis may be slightly tilted (e.g., about $-5°≤θ≤15°$) with respect to the thickness direction.

The vibrating piece 3 includes a base section 31 located in the center, first and second detection arms 321 and 322 extending from the base section 31 to both sides in the Y-axis direction, first and second coupling arms 331 and 332 extending from the base section 31 to both sides in the X-axis direction, first and second driving arms 341 and 342 extending from the distal end of the first coupling arm 331 to both sides in the Y-axis direction, and third and fourth driving arms 343 and 344 extending from the distal end of the second coupling arm 332 to both sides in the Y-axis direction.

The first detection arm 321 extends from the base section 31 in a +Y-axis direction. A wide hammerhead 3211 is provided at the distal end of the first detection arm 321. On the other hand, the second detection arm 322 extends from the base section 31 in a −Y-axis direction. A wide hammerhead 3221 is provided at the distal end of the second detection arm 322. The first and second detection arms 321 and 322 are arranged surface-symmetrically with respect to an XZ plane that passes the center of gravity G of the gyro element 2. Note that hammerheads 3211 and 3221 only have to be provided according to necessity and may be omitted. Bottomed grooves extending in the length direction may be formed on the upper surfaces and the lower surfaces of the first and second detection arms 321 and 322 according to necessity.

The first coupling arm 331 extends from the base section 31 in a +X-axis direction. On the other hand, the second coupling arm 332 extends from the base section 31 in a −X-axis direction. The first and second coupling arms 331 and 332 are arranged surface-symmetrically with respect to a YZ plane that passes the center of gravity G.

The first driving arm 341 extends from the distal end of the first coupling arm 331 in the +Y-axis direction. A wide hammerhead 3411 is provided at the distal end of the first driving arm 341. The second driving arm 342 extends from the distal end of the first coupling arm 331 in the −Y-axis direction. A wide hammerhead 3421 is provided at the distal end of the second driving arm 342. The third driving arm 343 extends from the distal end of the second coupling arm 332 in the +Y-axis direction. A wide hammerhead 3431 is provided at the distal end of the third driving arm 343. The fourth driving arm 344 extends from the distal end of the second coupling arm 332 in the −Y-axis direction. A wide hammerhead 3441 is provided at the distal end of the fourth driving arm 344. The four driving arms 341, 342, 343, and 344 are arranged point-symmetrically with respect to the center of gravity G. Note that the hammerheads 3411, 3421, 3431, and 3441 only have to be provided according to necessity and may be omitted. Bottomed grooves extending in the length direction may be formed on the upper surfaces and the lower surfaces of the driving arms 341, 342, 343, and 344.

Electrode

As shown in FIGS. 4 and 5, the electrode includes first detection signal electrodes 411, a first detection signal terminal 412, first detection ground electrodes 421, a first detection ground terminal 422, second detection signal electrodes 431, a second detection signal terminal 432, second detection ground electrodes 441, a second detection ground terminal 442, driving signal electrodes 451, a driving signal terminal 452, driving ground electrodes 461, and a driving ground terminal 462. Note that, in FIGS. 3 and 4, for convenience of explanation, the first and second detection signal electrodes 411 and 431 and the first and second detection signal terminals 412 and 432, the first and second detection ground electrodes 421 and 441 and the first and second detection ground terminals 422 and 442, the driving signal electrodes 451 and the driving signal terminal 452, and the driving ground electrodes 461 and the driving ground terminal 462 are respectively indicated by different kinds of hatching. The electrode formed on the side surface of the vibrating piece 3 is indicated by a thick line.

The first detection signal electrodes 411 are formed on the upper surface and the lower surface (portions excluding the hammer head 3211) of the first detection arm 321. The second detection signal electrodes 431 are formed on the upper surface and the lower surface (portions excluding the hammerhead 3221) of the second detection arm 322. The first and second detection signal electrodes 411 and 431 are electrodes for detecting, when detection vibration of the first and second detection arms 321 and 322 is excited, charges generated by the vibration.

The first detection signal terminal 412 is provided on the +Y-axis side of a row on the +X-axis side of the base section 31 and electrically connected to the first detection signal electrodes 411, which are formed in the first detection arm 321, via not-shown wires. The second detection signal terminal 432 is provided on the −Y-axis side of the row on the +X-axis side of the base section 31 and electrically connected to the second detection signal electrodes 431, which are formed in the second detection arm 322, via not-shown wires.

The first detection ground electrodes 421 are formed on both side surfaces of the first detection arm 321 and electrically connected to each other through the hammerhead 3211. Similarly, the second detection ground electrodes 441 are formed on both side surfaces of the second detection arm 322 and electrically connected to each other through the hammerhead 3221. The first and second detection ground electrodes 421 and 441 have potential serving as a ground with respect to the first and second detection signal electrodes 411 and 431.

The first detection ground terminal 422 is provided on the +Y-axis side of a row of on the −X-axis side of the base section 31 and electrically connected to the first detection ground electrodes 421, which are formed in the first detection arm 321, via not-shown wires. The second detection ground terminal 442 is provided on the −Y-axis side or the row on the −X-axis side of the base section 31 and electrically connected to the second detection signal electrodes 431, which are formed in the second detection arm 322, via not-shown wires.

The first and second detection signal electrodes 411 and 431, the first and second detection signal terminals 412 and 432, the first and second detection ground electrodes 421 and 441, and the first and second detection ground terminals 422 and 442 are arranged as explained above. Consequently, detection vibration generated in the first detection arm 321 appears as charges between the first detection signal electrodes 411 and the first detection ground electrodes 421. The detection vibration can be extracted from the first detection signal terminal 412 and the first detection ground terminal 422 as a signal (a detection signal). Detection vibration generated in the second detection arm 322 appears as charges between the second detection signal electrodes 431 and the second detection ground electrodes 441. The detection vibration can be extracted from the second detection signal terminal 432 and the second detection ground terminal 442 as a signal (a detection signal).

The driving signal electrodes 451 are formed on the upper surface and the lower surface (portions excluding the hammerheads 3411 and 3421) of the first and second driving arms 341 and 342. Further, the driving signal electrodes 451 are formed on both side surfaces of the third and fourth driving arms 343 and 344 and electrically connected to each other through the hammerheads 3431 and 3441. The driving signal electrodes 451 are electrodes for exciting driving vibration of the first, second, third, and fourth driving arms 341, 342, 343, and 344.

The driving signal terminal 452 is provided in the center of the row on the −X-axis side of the base section 31 (i.e., between the first detection ground terminal 422 and the second detection ground terminal 442) and electrically connected to the driving signal electrodes 451, which are formed in the first, second, third, and fourth driving arms 341, 342, 343, and 344, via not-shown wires.

The driving ground electrodes 461 are formed on the upper surface and the lower surface (portions excluding the hammerheads 3431 and 3441) of the third and fourth driving arms 343 and 344. Further, the driving ground electrodes 461 are formed on both side surfaces of the first and second driving arms 341 and 342 and electrically connected to each other through the hammerheads 3411 and 3421. The driving ground electrodes 461 have potential serving as a ground with respect to the driving signal electrodes 451.

The driving ground terminal 462 is provided in the center of the row on the +X-axis side of the base section 31 (i.e., between the first detection signal terminal 412 and the second detection signal terminal 432) and electrically connected to the driving ground electrodes 461, which are formed in the first, second, third, and fourth driving arms 341, 342, 343, and 344, via not-shown wires.

The driving signal electrodes 451, the driving signal terminal 452, the driving ground electrodes 461, and the driving ground terminal 462 are arranged as explained above. Consequently, by applying a driving signal between the driving signal terminal 452 and the driving ground terminal 462, it is possible to generate an electric field between the driving signal electrodes 451 and the driving ground electrodes 461 formed in the first, second, third, and fourth driving arms 341, 342, 343, and 344 and drive and vibrate the driving arms 341, 342, 343, and 344.

The configuration of the electrode is not particularly limited as long as the electrode has electric conductivity. The electrode can be formed by, for example, a metal film formed by laminating films of Ni (nickel), Au (gold), Ag (silver), Cu (copper), and the like on a metalized layer (a base layer) of Cr (chrome), W (tungsten), or the like.

Note that metal films formed on the hammerheads 3211 and 3221 function as adjustment films for adjusting a frequency of a detection vibration mode. The frequency of the detection vibration mode can be adjusted by, for example, removing a part of the metal films with laser irradiation or the like and adjusting the mass of the first and second detection arms 321 and 322. On the other hand, metal films formed on the hammerheads 3411, 3421, 3431, and 3441 function as adjustment films for adjusting a frequency of a driving vibration mode. The frequency of the driving vibration mode can be adjusted by, for example, removing a part of the metal films with laser irradiation or the like and adjusting the mass of the driving arms 341, 342, 343, and 344.

The configuration of the gyro element 2 is briefly explained above. Driving of the gyro element 2 is briefly explained below.

In a state in which angular velocity is not applied to the gyro element 2, when a voltage (an alternating voltage) is applied between the driving signal terminal 452 and the driving ground terminal 462, an electric field is generated between the driving signal electrodes 451 and the driving ground electrodes 461. As shown in FIG. 6A, the driving arms 341, 342, 343, and 344 perform bending vibration in directions indicated by an arrow A. In this case, the first and second driving arms 341 and 342 and the third and fourth driving arms 343 and 344 perform surface-symmetrical vibration with respect to the YZ plane that passes the center of gravity G of the gyro element 2. Therefore, the base section 31, the first and second detection arms 321 and 322, and the first and second coupling arms 331 and 332 hardly vibrate.

In a state in which the driving vibration is performed, when angular velocity ω around the Z axis is applied to the gyro element 2, detection vibration shown in FIG. 6B is excited. Specifically, a Coriolis force in an arrow B direction acts on the driving arms 341, 342, 343, and 344 and the first and second coupling arms 331 and 332 and new vibration is excited. The vibration in the arrow B direction is vibration in the circumferential direction with respect to the center of gravity G. At the same time, detection vibration in an arrow C direction is excited in the first and second detection arms 321 and 322 in response to the vibration in the arrow B direction. Charges generated in the first and second detection arms 321 and 322 by the vibration are extracted as signals from the first and second detection signal electrodes 411 and 431 and the first and second detection ground electrodes 421 and 441. The angular velocity ω is calculated on the basis of the signals.

Package

As shown in FIGS. 1 and 2, the package 5 includes a box-like base (base body) 6 having a recessed section 61 opening in the upper surface and a tabular lid (lid body) 7 joined to the base 6 to close the opening of the recessed section 61. The gyro element 2 is housed in an internal space S formed by closing the opening of the recessed section 61 with the lid 7. An atmosphere in the internal space S is not particularly limited. However, in this embodiment, the internal space S is in a vacuum state (e.g., a decompressed state of 10 Pa or less).

Base

The base 6 has a substantially oblong (rectangular) external shape in a plan view of the base 6. The base 6 includes a pair of outer edges 631 and 632 extending in the major axis direction and a pair of outer edges 633 and 634 extending in the minor axis direction (a direction crossing the major axis direction). However, the plan-view shape of the base 6 is not limited to the oblong shape and may be, for example, a square shape, may be a polygonal shape having five or more corners, or may be a deformed shape.

"Substantially oblong" in this specification is meant to include not only a complete oblong shape but also a shape substantially regarded as an oblong shape, specifically, a shape obtained by rounding at least one corner of the four corners of an oblong shape and a shape obtained by forming a curved or bent portion in at least one side of the four sides of the oblong shape.

The base 6 is formed by laminating a plurality of rectangular substrates (sheets) formed by molding an aluminum oxide-based, silicon carbide-based, mullite-based, or glass ceramic-based ceramic green sheet and sintering the substrates (the sheets). The number of laminated sheets is not particularly limited. However, in this embodiment, six sheets, specifically, a first substrate 6A, a second substrate 6B, a third substrate 6C, a fourth substrate 6D, a fifth substrate 6E, and a sixth substrate 6F are laminated in order from the lower side in FIG. 2 (the opposite side of the lid 7).

The recessed section 61 includes a bottomed first recessed section 611 opening in the upper surface of the base 6, a bottomed second recessed section 612 opening in the bottom section of the first recessed section 611 and smaller than the first recessed section 611, and a bottomed third recessed section 613 opening in the bottom section of the second recessed section 612 and smaller than the second recessed section 612. The first recessed section 611 is formed by a through-hole formed in the sixth substrate 6F. The second recessed section 612 is formed by a through-hole formed in the fifth substrate 6E. The third recessed section 613 is formed by a through-hole continuously formed in the fourth substrate 6D and the third substrate 6C. In the fifth substrate 6E, cutouts 651 and 652 connected to the second recessed section 612 are formed.

The first recessed section 611, the second recessed section 612, and the third recessed section 613 are respectively formed in substantially oblong (rectangular) external shapes in plan views thereof. The major axis direction of the recessed sections substantially coincides with the major axis direction of the base 6.

As shown in FIG. 9B, the first recessed section 611 includes a pair of long sides 611a and 611b extending in the major axis direction and a pair of short sides 611c and 611d extending in the minor axis direction. Corners of the first recessed section 611 are rounded.

As shown in FIG. 9A, the second recessed section 612 includes a pair of long sides 612a and 612b extending in the major axis direction and a pair of short sides 612c and 612d extending in the minor axis direction. Corners of the second recessed section 612 are rounded. In a plan view of the base 6, four sides 612a to 612d are located further on the inner side than the first recessed section 611. In the side 612c, the cutouts 651 and 652 extending to the outer edge 633 side of the base 6 are formed.

As shown in FIGS. 8A and 8B, the third recessed section 613 includes a pair of long sides 613a and 613b extending in the major axis direction and a pair of short sides 613c and 613d extending in the minor axis direction. Corners of the third recessed section 613 are rounded. In the plan view of the base 6, the three sides 612a, 612b, and 612c are located further on the inner side than the second recessed section 612. The remaining side 613d overlaps the short side 612d of the second recessed section 612.

On the bottom surface of the recessed section 61 (the bottom surface of the third recessed section 613; the upper surface of the second substrate 6B), the IC 10 is fixed by a conductive bonding material K such as silver (Ag) paste. The IC 10 is electrically connected to a wire group 8, which is formed in the base 6, by conductive wires (bonding wires) 821 to 835.

The IC 10 incorporates, for example, a driving circuit for driving to vibrate the gyro element 2 (i.e., a driving circuit for applying a voltage between the driving signal electrodes 451 and the driving ground electrodes 461) and a detection circuit that detects detection vibration caused in the gyro element 2 when the angular velocity ω is applied (i.e., a detection circuit that detects charges between the first detection signal electrode 411 and the first detection ground electrodes 421 and charges between the second detection signal electrodes 431 and the second detection ground electrodes 441).

The IC 10 is formed in a substantially oblong (rectangular) external shape in a plan view thereof. The major axis direction of the IC 10 substantially coincides with the major axis direction of the base 6. As shown in FIG. 10, the IC 10 includes a pair of outer edges (first element outer edges) 101 and 102 extending in the major axis direction and a pair of outer edges (second element outer edges) 103 and 104 extending in the minor axis direction (a direction crossing the major axis direction). However, the plan-view shape of the IC 10 is not limited to the oblong shape and, for example, may be a square shape, may be a polygonal shape having five or more corners, or may be a deformed shape.

As shown in FIG. 2, a through-hole 62 that causes the inside and the outside of the recessed section 61 to communicate is formed in the bottom section of the base 6. The through-hole 62 is a hole for drawing a vacuum in the internal space S. After the air in the internal space S is removed via the through-hole 62, the through-hole 62 is sealed by a sealing material M made of an Au-Ge-based alloy or the like. Consequently, it is possible to maintain the internal space S in a vacuum state. Note that, in FIG. 2, an inner side opening of the through-hole 62 is shown as being closed by the IC 10 (the conductive bonding material K). However, actually, the IC 10 is fixed not to close the inner side opening of the through-hole 62.

The through-hole 62 is formed by a lower side through-hole 62A formed in the first substrate 6A and an upper side through-hole 62B formed in the second substrate 6B. The diameter of the upper side through-hole 62B is smaller than the diameter of the lower side through-hole 62A. Therefore, a step section 62C formed by the lower surface of the second substrate 6B is formed halfway in the through-hole 62. Since the through-hole 62 has the step section 62C, sealing of the through-hole 62 by the sealing material M can be easily performed. Specifically, first, a spherical metal ball (material serving as the sealing material M) made of an Au-Ge-based alloy or the like and smaller than the lower side through-hole 62A and larger than the upper side through-hole 62B is prepared. The metal ball is led into the through-hole 62 from the lower side through-hole 62A side. The metal ball led into the through-hole 62 is caught by the step section 62C and stays. Therefore, the through-hole 62 can be sealed by the sealing material M by irradiating a laser or the like on the metal ball and melting the metal ball.

On side surfaces (side surfaces extending in the major axis direction) 631' and 632' of the base 6 corresponding to the outer edges 631 and 632, a plurality of cutouts extending from the upper surface to the lower surface of the base 6 are respectively formed. Specifically, on the side surface 631' corresponding to the outer edge 631, five cutouts 640, 641, 642, 643, and 644 are formed to be arranged at substantially equal intervals. On the side surface 632' corresponding to the outer edge 632, five cutouts 645, 646, 647, 648, and 649 are formed to be arranged at substantially equal intervals. Apart of the wire group 8 is formed in the cutouts 640 to 649.

The wire group 8 arranged on the base 6 is explained in detail with reference to FIGS. 7A to 10. FIG. 7A is a top transparent view of the first substrate 6A. FIG. 7B a top view of the second substrate 6B. FIG. 8A is a top view of the third substrate 6C. FIG. 8B is a top view of the fourth substrate 6D. FIG. 9A is a top view of the fifth substrate 6E. FIG. 9B is a top view of the sixth substrate 6F. FIG. 10 is a top view of the base 6.

The wire group 8 includes an S1 wire 801, an S2 wire 802, GND wires 803 functioning as ground wires, a DS wire 804, a DG wire 805, a CLK wire 806, a DI wire 807, a DO wire 808, a CS wire 809, a VDD1 wire 810, a TEST1 wire 811, a DRY wire 812, a TEST2 wire 813, and a VDD2 wire 814. Note that, among the wires, the S1 wire 801, the S2 wire 802, and DG wire 805 are included in the "second wire" according to the invention. The GND wires 803, the DS wire 804, the CLK wire 806, the DI wire 807, the DO wire 808, the CS wire 809, the VDD1 wire 810, the TEST1 wire 811, the DRY wire 812, the TEST2 wire 813, and the VDD2 wire 814 are included in the "first wires" according to the invention. The wire group 8 may include wires other than these wires. At least one of the wires may be omitted.

The configuration of the wires 801 to 814 is not particularly limited. However, the wires 801 to 814 can be formed by, for example, metal films formed by laminating a plated metal layer of gold (Au) or the like on a base layer of tungsten (W), molybdenum (Mo), manganese (Mg), or the like. The plated metal layer is formed by, for example, an electroplating method.

The wires 801 to 814 are explained in order.

S1 Wire

As shown in FIGS. 8B and 9A, the S1 wire 801 includes an S1 internal terminal 801a at one end thereof and includes an S1 connection terminal 801b at the other end thereof. The S1 wire 801 is electrically connected to the IC 10 in the S1 internal terminal 801a and electrically connected to the first detection signal terminal 412 in the S1 connection terminal 801b. As shown in FIG. 10, the electric connection of the S1 internal terminal 801a and the IC 10 is performed by the conductive wire 821. On the other hand, the electric connection of the S1 connection terminal 801b and the first detection signal terminal 412 is performed via the supporting substrate 9.

The S1 internal terminal 801a is formed on the upper surface of the fourth substrate 6D and arranged along the outer edge 633 of the base 6 (the outer edge 103 of the IC 10 and the short side 613c of the third recessed section 613). The S1 internal terminal 801a is arranged closer to the outer edge 631 side. On the other hand, the S1 connection terminal 801b is formed on the upper surface of the fifth substrate 6E and provided along the outer edge 633 of the base 6 (the short side 612c of the second recessed section 612). The S1 connection terminal 801b is arranged further on the outer edge 631 side than the cutout 651.

The S1 wire 801 is formed to extend across the fourth substrate 6D and the fifth substrate 6E. The wire is drawn around from the fourth substrate 6D to the fifth substrate 6E though a via (a through electrode) 801c formed in the fifth substrate 6E. Note that, although the via 801c is hidden behind the wire, for convenience of explanation, the position of the via 801c is indicated by a white circle.

S2 Wire

As shown in FIGS. 8B and 9A, the S2 wire 802 includes an S2 internal terminal 802a at one end thereof and includes an S2 connection terminal 802b at the other end thereof. The S2 wire 802 is electrically connected to the IC 10 in the S2 internal terminal 802a and electrically connected to the second detection signal terminal 432 in the S2 connection terminal 802b. As shown in FIG. 10, the electric connection of the S2 internal terminal 802a and the IC 10 is performed by the conductive wire 822. On the other hand, the electric connection of the S2 connection terminal 802b and the second detection signal terminal 432 is performed via the supporting substrate 9.

The S2 internal terminal 802a is formed on the upper surface of the fourth substrate 6D and arranged along the outer edge 633 of the base 6 (the outer edge 103 of the IC 10 and the short side 613c of the third recessed section 613). The S2 internal terminal 802a is arranged closer to the outer edge 632 side. On the other hand, the S2 connection terminal 802b is formed on the upper surface of the fifth substrate 6E and provided along the outer edge 633 of the base 6 (the short side 612c of the second recessed section 612). The S2 connection terminal 802b is arranged further on the outer edge 632 side than the cutout 652.

The S2 wire 802 is formed to extend across the fourth substrate 6D and the fifth substrate 6E. The wire is drawn around from the fourth substrate 6D to the fifth substrate 6E through a via 802c formed in the fifth substrate 6E. Note that, although the via 802c is hidden behind the wire, for convenience of explanation, the position of the via 802c is indicated by a white circle.

In the plan view of the base 6, the S1 wire 801 and the S2 wire 802 explained above are arranged line-symmetrically with respect to a straight line L (see FIG. 8B) that crosses the center of the base 6 and extends along the major axis of the base 6.

DG Wire

As shown in FIGS. 8B and 9A, the DG wire 805 includes a DG internal terminal 805a at one end thereof and includes a DG connection terminal 805b at the other end thereof. The DG wire 805 is electrically connected to the IC 10 in the DG internal terminal 805a and electrically connected to the driving ground terminal 462 in the DG connection terminal 805b. As shown in FIG. 10, the electric connection of the DG internal terminal 805a and the IC 10 is performed by the conductive wire 823. On the other hand, the electric connection of the DG connection terminal 805b and the driving ground terminal 462 is performed via the supporting substrate 9.

The DG internal terminal 805a is formed on the upper surface of the fourth substrate 6D and provided along the outer edge 633 of the base 6 (the outer edge 103 of the IC 10 and the short side 613c of the third recessed section 613). The DG internal terminal 805a is arranged between the S1 internal terminal 801a and the S2 internal terminal 802a. On the other hand, the DG connection terminal 805b is formed on the upper surface of the fifth substrate 6E and provided along the outer edge 633 of the base 6 (the short side 612c of the second recessed section 612) . The DG connection terminal 805b is arranged between the cutouts 651 and 652 (between the S1 and S2 connection terminals 801b and 802b).

The DG wire 805 is formed to extend across the fourth substrate 6D and the fifth substrate 6E. The wire is drawn around from the fourth substrate 6D to the fifth substrate 6E through a via 805c formed in the fifth substrate 6E. Note that, although the via 805c is hidden behind the wire, for convenience of explanation, the position of the via 805c is indicated by a white circle.

CLK Wire

As shown in FIGS. 7A to 8B, the CLK wire 806 includes a CLK internal terminal 806a at one end thereof and includes a CLK external terminal 806b at the other end thereof. The CLK wire 806 is electrically connected to the IC 10 in the CLK internal terminal 806a. As shown in FIG. 10, the electric connection of the CLK internal terminal 806a and the IC 10 is performed by the conductive wire 824.

The CLK internal terminal 806a is formed on the upper surface of the fourth substrate 6D and provided along the outer edge 631 of the base 6 (the outer edge 101 of the IC 10 and the long side 613a of the third recessed section 613). The CLK internal terminal 806a is arranged on the short side 613d side of the long side 613a. On the other hand, the CLK external terminal 806b is arranged along the outer edge 631 on the lower surface of the first substrate 6A (the bottom surface of the base 6) and in the vicinity of the cutout 640.

The CLK wire 806 is formed to extend across the fourth substrate 6D to the first substrate 6A. The wire is drawn around from the fourth substrate 6D to the first substrate 6A by a CLK side surface electrode 806c formed in the cutout 640. The CLK internal terminal 806a and the CLK side surface electrode 806c are connected via the wire formed on the upper surface of the fourth substrate 6D.

DO Wire

As shown in FIGS. 7A to 8B, the DO wire 808 includes a DO internal terminal 808a at one end thereof and includes a DO external terminal 808b at the other end thereof. The DO wire 808 is electrically connected to the IC 10 in the DO internal terminal 808a. As shown in FIG. 10, the electric connection of the DO internal terminal 808a and the IC 10 is performed by the conductive wire 825.

The DO internal terminal 808a is formed on the upper surface of the fourth substrate 6D and arranged along the outer edge 631 of the base 6 (the outer edge 101 of the IC 10 and the long side 613a of the third recessed section 613). The DO internal terminal 808a is arranged on the short side 613d side of the long side 613a and on the right of the CLK internal terminal 806a. On the other hand, the DO external terminal 808b is arranged along the outer edge 631 on the lower surface of the first substrate 6A (the bottom surface of the base 6) and in the vicinity of the cutout 641.

The DO wire 808 is formed to extend across the fourth substrate 6D to the first substrate 6A. The wire is drawn around from the fourth substrate 6D to the first substrate 6A by a DO side surface electrode 808c formed in the cutout 641. The DO internal terminal 808a and the DO side surface electrode 808c are connected via the wire formed on the upper surface of the fourth substrate 6D.

VDD1 Wire

As shown in FIGS. 7A to 8B, the VDD1 wire 810 includes a VDD1 internal terminal 810a at one end thereof and includes a VDD1 external terminal 810b at the other end thereof. The VDD1 wire 810 is electrically connected to the IC 10 in the VDD1 internal terminal 810a. As shown in FIG. 10, the electric connection of the VDD1 internal terminal 810a and the IC 10 is performed by the conductive wire 826.

The VDD1 internal terminal 810a is formed on the upper surface of the fourth substrate 6D and arranged along the outer edge 631 of the base 6 (the outer edge 101 of the IC 10 and the long side 613a of the third recessed section 613). The VDD1 internal terminal 810a is arranged on the short side 613d side of the long side 613a and arranged on the right of the DO internal terminal 808a. On the other hand, the VDD1 external terminal 810b is arranged along the outer edge 631 on the lower surface of the first substrate 6A (the bottom surface of the base 6) and in the vicinity of the cutout 642.

The VDD1 wire 810 is formed to extend across the fourth substrate 6D to the first substrate 6A. The wire is drawn around from the fourth substrate 6D to the first substrate 6A by a VDD1 side surface electrode 810c formed in the cutout 642. The VDD1 internal terminal 810a and the VDD1 side surface electrode 810c are connected via the wire formed on the upper surface of the fourth substrate 6D.

VDD2 Wire

As shown in FIGS. 7A to 8B, the VDD2 wire 814 includes a VDD2 internal terminal 814a at one end thereof and includes a VDD2 external terminal 814b at the other end thereof. The VDD2 wire 814 is electrically connected to the IC 10 in the VDD2 internal terminal 814a. As shown in FIG. 10, the electric connection of the VDD2 internal terminal 814a and the IC 10 is performed by the conductive wire 827.

The VDD2 internal terminal 814a is formed on the upper surface of the fourth substrate 6D and arranged along the outer edge 631 of the base 6 (the outer edge 101 of the IC 10 and the long side 613a of the third recessed section 613). The VDD2 internal terminal 814a is arranged substantially in the center of the long side 613a and on the right of the VDD1 internal terminal 810a. On the other hand, the VDD2 external terminal 814b is arranged along the outer edge 631 on the lower surface of the first substrate 6A (the bottom surface of the base 6) and in the vicinity of the cutout 644.

The VDD2 wire 814 is formed to extend across the fourth substrate 6D to the first substrate 6A. The wire is drawn around from the fourth substrate 6D to the second substrate 6B through a via 814e formed in the fourth substrate 6D and the third substrate 6C and drawn out from the second substrate 6B to the first substrate 6A by a VDD2 side surface electrode 814c formed in the cutout 644. Note that, the via 814e is hidden behind the wire, for convenience of explanation, the position of the via 814e is indicated by a white circle.

DRY Wire

As shown in FIGS. 7A to 8B, the DRY wire 812 includes a DRY internal terminal 812a at one end thereof and includes a DRY external terminal 812b at the other end thereof. The DRY wire 812 is electrically connected to the IC 10 in the DRY internal terminal 812a. As shown in FIG. 10, the electric connection of the DRY internal terminal 812a and the IC 10 is performed by the conductive wire 828.

The DRY internal terminal 812a is formed on the upper surface of the fourth substrate 6D and arranged along the outer edge 631 of the base 6 (the outer edge 101 of the IC 10 and the long side 613a of the third recessed section 613). The DRY internal terminal 812a is arranged on the short side 613c side of the long side 613a and on the right of the VDD2 internal terminal 814a. On the other hand, the DRY external terminal 812b is arranged along the outer edge 631 on the lower surface of the first substrate 6A (the bottom surface of the base 6) and in the vicinity of the cutout 643.

The DRY wire 812 is formed to extend across the fourth substrate 6D to the first substrate 6A. The wire is drawn around from the fourth substrate 6D to the first substrate 6A by a DRY side surface electrode 812c formed in the cutout 644. The DRY internal terminal 812a and the DRY side surface electrode 812c are connected via the wire formed on the upper surface of the fourth substrate 6D.

DS Wire

As shown in FIGS. 7A to 8B, the DS wire 804 includes a DS internal terminal 804a at one end thereof and includes a DS connection terminal 804b at the other end thereof. The DS wire 804 is electrically connected to the IC 10 in the DS internal terminal 804a and electrically connected to the driving signal terminal 452 in the DS connection terminal 804b. As shown in FIG. 10, the electric connection of the DS internal terminal 804a and the IC 10 is performed by the conductive wire 829. On the other hand, the electric connection of the DS connection terminal 804b and the driving signal terminal 452 is performed via the supporting substrate 9.

The DS internal terminal 804a is formed on the upper surface of the fourth substrate 6D and arranged along the outer edge 632 of the base 6 (the outer edge 102 of the IC 10 and the long side 613b of the third recessed section 613). The DS internal terminal 804a is arranged on the short side 613d side of the long side 613b. On the other hand, the DS connection terminal 804b is formed on the upper surface of the fifth substrate 6E and provided along the outer edge 634 of the base 6 (the short side 612d of the second recessed section 612). The DS connection terminal 804b is arranged in the center of the short side 612d.

The DS wire 804 is formed to extend across the fourth substrate 6D and the fifth substrate 6E. The wire is drawn around from the fourth substrate 6D to the fifth substrate 6E through a via 804c formed in the fifth substrate 6E. Note that, although the via 804c is hidden behind the wire, for convenience of explanation, the position of the via 804c is indicated by a white circle.

DI Wire

As shown in FIGS. 7A to 8B, the DI wire 807 includes a DI internal terminal 807a at one end thereof and includes a DI external terminal 807b at the other end thereof. The DI wire 807 is electrically connected to the IC 10 in the DI internal terminal 807a. As shown in FIG. 10, the electric connection of the DI internal terminal 807a and the IC 10 is performed by the conductive wire 830.

The DI internal terminal 807a is formed on the upper surface of the fourth substrate 6D and arranged along the outer edge 632 of the base 6 (the outer edge 102 of the IC 10 and the long side 613b of the third recessed section 613). The DI internal terminal 807a is arranged on the short side 613d side of the long side 613b and on the right of the DS internal terminal 804a. On the other hand, the DI external terminal 807b is arranged along the outer edge 632 on the lower surface of the first substrate 6A (the bottom surface of the base 6) and in the vicinity of the cutout 645.

The DI wire 807 is formed to extend across the fourth substrate 6D to the first substrate 6A. The wire is drawn around from the fourth substrate 6D to the third substrate 6C through a via 807e formed in the fourth substrate 6D. The wire is drawn around from the third substrate 6C to the first substrate 6A by a DI side surface electrode 807c formed in the cutout 645. Note that, although the via 807e is hidden behind the wire, for convenience of explanation, the position of the via 807e is indicated by a white circle.

CS Wire

As shown in FIGS. 7A to 8B, the CS wire 809 includes a CS internal terminal 809a at one end thereof and includes a CS external terminal 809b at the other end thereof. The CS wire 809 is electrically connected to the IC 10 in the CS internal terminal 809a. As shown in FIG. 10, the electric connection of the CS internal terminal 809a and the IC 10 is performed by the conductive wire 831.

The CS internal terminal 809a is formed on the upper surface of the fourth substrate 6D and arranged along the outer edge 632 of the base 6 (the outer edge 102 of the IC chip 10 and the long side 613b of the third recessed section 613). The CS internal terminal 809a is arranged on the short side 613d side of the long side 613b and on the right of the DI internal terminal 807a. On the other hand, the CS external terminal 809b is arranged on the outer edge 632 on the lower surface of the first substrate 6A (the bottom surface of the base 6) and in the vicinity of the cutout 646.

As explained above, the CS internal terminal 809a is formed on the fourth substrate 6D and the CS external terminal 809b is formed on the first substrate 6A. Therefore, the CS wire 809 is formed to extend across the fourth substrate 6D to the first substrate 6A. The wire is drawn around from the fourth substrate 6D to the first substrate 6A by a CS side surface electrode 809c formed in the cutout 646. The CS internal terminal 809a and the CS side surface electrode 809c are connected via the wire formed on the upper surface of the fourth substrate 6D.

TEST1 Wire

As shown in FIGS. 7A to 8B, the TEST1 wire 811 includes a TEST1 internal terminal 811a at one end thereof and includes a TEST1 external terminal 811b at the other end thereof. The TEST1 wire 811 is electrically connected to the IC 10 in the TEST1 internal terminal 811a. As shown in FIG. 10, the electric connection of the TEST1 internal terminal 811a and the IC 10 is performed by the conductive wire 832.

The TEST1 internal terminal 811a is formed on the upper surface of the fourth substrate 6D and provided along the outer edge 632 of the base 6 (the outer edge 102 of the IC 10 and the long side 613b of the third recessed section 613). The TEST1 internal terminal 811a is arranged substantially in the center of the long side 613b and on the right of the CS internal terminal 809a. On the other hand, the TEST1 external terminal 811b is arranged along the outer edge 632 on the lower surface of the first substrate 6A (the bottom surface of the base 6) and in the vicinity of the cutout 647.

The TEST1 wire 811 is formed to extend across the fourth substrate 6D to the first substrate 6A. The wire is drawn around from the fourth substrate 6D to the first substrate 6A by a TEST1 side surface electrode 811c formed in the cutout 647. The TEST1 internal terminal 811a and the TEST1 side surface electrode 811c are connected via the wire formed on the upper surface of the fourth substrate 6D.

TEST2 Wire

As shown in FIGS. 7A to 8B, the TEST2 wire 813 includes a TEST2 internal terminal 813a at one end thereof and includes a TEST2 external terminal 813b at the other end thereof. The TEST2 wire 813 is electrically connected to the IC 10 in the TEST2 internal terminal 813a. As shown in FIG. 10, the electric connection of the TEST2 internal terminal 813a and the IC 10 is performed by the conductive wire 833.

The TEST2 internal terminal 813a is formed on the upper surface of the fourth substrate 6D and arranged along the outer edge 632 of the base 6 (the outer edge 102 of the IC 10 and the long side 613b of the third recessed section 613). The TEST2 internal terminal 813a is arranged on the short side 613c side of the long side 613b and on the right of the TEST1 internal terminal 811a. On the other hand, the TEST2 external terminal 813b is arranged along the outer edge 632 on the lower surface of the first substrate 6A (the bottom surface of the base 6) and in the vicinity of the cutout 648.

The TEST2 wire 813 is formed to extend across the fourth substrate 6D to the first substrate 6A. The wire is drawn around from the fourth substrate 6D to the first substrate 6A by a TEST2 side surface electrode 813c formed in the cutout 648. The TEST2 internal terminal 813a and the TEST2 side surface electrode 813c are connected via the wire formed on the upper surface of the fourth substrate 6D.

GND Wires

As shown in FIGS. 7A to 9B, the GND wires 803 are formed to extend across all the substrates 6A to 6F. The GND wires 803 are arranged to widely expand in the substrates 6A to 6F in a range in which the GND wires 803 do not hinder the other wires 801, 802, and 804 to 814 from being drawn around. Specifically, the GND wires 803 are provided inmost of an area on the second substrate 6B, provided to surround the third recessed section 613 on the third and fourth substrates 6C and 6D, provided in a "C" shape to surround the second recessed section 612 on the fifth substrate 6E, and provided in an annular shape to surround the first recessed section 611 on the sixth substrate 6F.

Note that the GND wire 803 arranged on the sixth substrate 6F also functions as a metalized layer 803' used for joining with the lid 7.

The GND wires 803 include GND internal terminals 803a' and 803a", GND connection terminals 803b' and 803b", and a GND external terminal 803c. The GND wire 803 is electrically connected to the IC 10 in at least one of the GND internal terminals 803a' and 803a" (in this embodiment, the GND internal terminal 803a") and electrically connected to the first and second detection ground terminals 422 and 442 in the GND connection terminals 803b' and 803b". As shown in FIG. 10, the electric connection of the GND internal terminal 803a" and the IC 10 is performed by the conductive wire 835. On the other hand, the electric connection of the GND connection terminals 803b' and 803b" and the first and second detection ground terminals 422 and 442 is performed via the supporting substrate 9.

The GND internal terminal 803a' is formed on the upper surface of the fourth substrate 6D and arranged between the DRY internal terminal 812a and the S1 internal terminal 801a. On the other hand, the GND internal terminal 803a" is formed on the upper surface of the fourth substrate 6D and arranged between the TEST2 internal terminal 813a and the S2 internal terminal 802a. By arranging the GND internal terminals 803a' and 803a" in this way, the S1 and S2 internal terminals 801a and 802a and the internal terminals 803a, 804a, and 806a to 814a are separated from each other by the GND internal terminals 803a' and 803a".

The GND connection terminals 803b' and 803b" are formed on the upper surface of the fifth substrate 6E and provided along the outer edge 634 of the base 6 (the short side 612d of the second recessed section 612). The GND connection terminal 803b' is arranged on the outer edge 631 side. The GND connection terminal 803b" is arranged on the outer edge 632 side. That is, the GND connection terminals 803b' and 803b" are arranged to sandwich the DS connection terminal 804b therebetween. The GND connection terminals 803b' and 803b" are formed on the upper surface of the fifth substrate 6E and electrically connected by the GND wire 803 arranged to turn around the outer side of the three sides 612a, 612c, and 612b of the second recessed section 612.

The GND external terminal 803c is arranged along the outer edge 632 on the lower surface of the first substrate 6A (the bottom surface of the base 6) and in the vicinity of the cutout 649.

The GND wires 803 on the substrates 6A to 6F are electrically connected via a GND side surface electrode 803d formed in the cutout 649 and vias 803e formed in the third substrate 6C to the sixth substrate 6F. Specifically, the wires are drawn around from the sixth substrate 6F to the fifth substrate 6E by a plurality of vias 803e formed in the sixth substrate 6F, drawn around from the fifth substrate 6E to the fourth substrate 6D through the vias 803e formed in the fifth substrate 6E, drawn around from the fourth substrate 6D to the third substrate 6C through the vias 803e formed in the forth substrate 6D, drawn around from the third substrate 6C to the second substrate 6B and from the second substrate 6B to the first substrate 6A by the GND side surface electrode 803*d* formed in the cutout 649. Note that, although the vias 803*e* are hidden behind the wires, the positions of the vias 803*e* are indicated by white circles.
Lid 7

As shown in FIGS. 1 and 2, the lid 7 is tabular and formed in a substantially oblong shape rounded at corners. For example, the lid 7 is joined to the metalized layer 803' (the GND wire 803), which is provided on the upper surface of the base 6, via a not-shown metal brazing material arranged on the lower surface of the lid 7.

A constituent material of the lid 7 is not particularly limited. However, the constituent material is desirably a member having a coefficient of linear expansion close to a coefficient of linear expansion of the constituent material of the base 6. For example, when the constituent material of the base 6 is the ceramics explained above, the constituent material is preferably an alloy such as Kovar. When the constituent material of the lid 7 is the alloy such as Kovar, it is possible to electrically connect the lid 7 to the GND wire 803. Therefore, it is possible to cause the lid 7 to function as a shield section for blocking noise from the outside of the package 5.

Supporting Substrate

The supporting substrate 9 is a substrate for TAB (Tape Automated Bonding) packaging known in the past.

As shown in FIGS. 1 and 11, the supporting substrate 9 includes a frame-like base section 91 and six bonding leads (wires) 92, 93, 94, 95, 96, and 97 provided on the base section 91.

The base section 91 is formed of resin having flexibility such as polyimide. The base section 91 has a substantially oblong external shape. The base section 91 is arranged in the first recessed section 611 such that the major axis thereof coincides with the major axis of the package 5.

The six bonding leads 92 to 97 are fixed to the lower surface of the base section 91 respectively by not-shown bonding materials. The bonding leads 92, 93, and 94 are arranged in a portion on the left side in the figure (one side in the major axis direction) of the base section 91. The distal ends of the bonding leads 92, 93, and 94 extend to the inside of an opening section 911 of the base section 91. On the other hand, the bonding leads 95, 96, and 97 are arranged in a portion on the right side in the figure (the other side in the major axis direction) of the base section 91. The distal ends of the bonding leads 95, 96, and 97 extend to the inside of the opening section 911 of the base section 91.

The distal ends of the bonding leads 92, 93, and 94 and the distal ends of the bonding leads 95, 96, and 97 are opposed to each other in the center of the opening section 911.

The bonding leads 92 to 97 are inclined halfway. The distal ends of the bonding leads 92 to 97 are located above the base section 91. The bonding leads 92 to 97 are narrowed halfway. The distal ends of the bonding leads 92 to 97 are thinner than the proximal ends thereof. The distal ends of the bonding leads 92 to 96 are arranged to correspond to (overlap) the first detection signal terminal 412, the first detection ground terminal 422, the second detection signal terminal 432, the second detection ground terminal 442, the driving signal terminal 452, and the driving ground terminal 462 included in the gyro element 2.

The proximal ends of the bonding leads 92 and 95 are connection terminals 921 and 951. The bonding leads 92 and 95 extend straight from the connection terminals 921 and 951. On the other hand, the proximal ends of the bonding leads 93, 94, 96, and 97 are connection terminals 931, 941, 961, and 971. The bonding leads 93, 94, 96, and 97 extend from the connection terminals 931, 941, 961, and 971 while bending at a right angle to the bonding leads 92 and 95 side. The connection terminals 921 to 971 are arranged to overlap the S1 connection terminal 801*b*, the S2 connection terminal 802*b*, the GND connection terminals 803*b*' and 803*b*", the DS connection terminal 804*b*, and the DG connection terminal 805*b* provided on the base 6.

The supporting substrate 9 having the configuration explained above is joined to the base 6 and the gyro element 2 via a conductive bonding material. Specifically, as shown in FIG. 12, the supporting substrate 9 and the base 6 are joined via six conductive bonding materials 511 to 516. The conductive bonding material 511 is provided in contact with the connection terminal 931 and the S1 connection terminal 801*b* and electrically connects the terminals. The conductive bonding material 512 is provided in contact with the connection terminal 921 and the DG connection terminal 805*b* and electrically connects the terminals. The conductive bonding material 513 is provided in contact with the connection terminal 941 and the S2 connection terminal 802*b* and electrically connects the terminals. The conductive bonding material 514 is provided in contact with the connection terminal 961 and the GND connection terminal 803*b*' and electrically connects the terminals. The conductive bonding material 515 is provided in contact with the connection terminal 951 and the DS connection terminal 804*b* and electrically connects the terminals. The conductive bonding material 516 are provided in contact with the connection terminal 971 and the GND connection terminal 803*b*" and electrically connects the terminals. Consequently, the supporting substrate 9 is fixed to and electrically connected to the base 6.

As shown in FIG. 13, the supporting substrate 9 and the gyro element 2 are joined via six conductive bonding materials 521 to 526. The conductive bonding material 521 is provided in contact with the distal end of the bonding lead 93 and the first detection signal terminal 412 and electrically connects the distal end and the first detection signal terminal 412. The conductive bonding material 522 is provided in contact with the distal end of the bonding lead 92 and the driving ground terminal 462 and electrically connects the distal end and the driving ground terminal 462. The conductive bonding material 523 is provided in contact with the distal end of the bonding lead 94 and the second detection signal terminal 432 and electrically connects the distal end and the second detection signal terminal 432. The conductive bonding material 524 is provided in contact with the distal end of the bonding lead 96 and the first detection ground terminal 422 and electrically connects the distal end and the first detection ground terminal 422. The conductive bonding material 525 is provided in contact with the distal end of the bonding lead 95 and the driving signal terminal 452 and electrically connects the distal end and the driving signal terminal 452. The conductive bonding material 526 is provided in contact with the distal end of the bonding lead 97 and the second detection ground terminal 442 and electrically connects the distal end and the second detection ground terminal 442. Consequently, the gyro element 2 is fixed to and electrically connected to the supporting substrate 9.

The conductive bonding materials 511 to 516 and 521 to 526 are not particularly limited and may be any bonding material as long as the bonding material has electric conductivity and adhesiveness. For example, a bonding material obtained by dispersing a conductive filler such as silver particles in a silicone-based, epoxy-based, acrylic-based, polyimide-based, or bismaleimide-based bonding material can be used. Note that the supporting substrate 9 and the base 6 may be joined and the supporting substrate 9 and the gyro element 2 may be joined using gold bumps, solder, or the like instead of the conductive bonding materials.

The configuration of the physical quantity sensor 1 is explained in detail above. The physical quantity sensor 1 having such a configuration can mainly display effects explained below.

First Effect

First, in the physical quantity sensor 1, the internal terminals (the internal terminals 803a, 804a, 806a, 807a, 808a, 809a, 810a, 811a, 812a, 813a, and 814a) of the plurality of first wires (the wires 803, 804, 806, 807, 808, 809, 810, 811, 812, 813, and 814) are arranged side by side along a first axis J1 that extends along the major axis direction of the base 6. The internal terminals (the internal terminals 801a, 802a, and 805a) of the plurality of second wires (the wires 801, 802, and 805) are arranged side by side along a second axis J2 that crosses the first axis J1 and extends along the minor axis direction of the base 6. The plurality of first wires include the digital signal wires (the CLK wire 806, the DI wire 807, the DO wire 808, and the CS wire 809). The internal terminals 806a, 807a, 808a, and 809a of the digital signal wires are arranged on the opposite side of the second axis J2 with respect to a center line Jc in the first axis J1 direction in the internal terminals of the plurality of first wires. In particular, digital signals transmitted by the digital signal wires tend to be the noise sources explained above. Therefore, in the physical quantity sensor 1, by adopting the arrangement explained above, the S1 and S2 wires 801 and 802 and the digital signal wires are largely separated from each other. Consequently, noise interference from the digital signal wires to the S1 and S2 wires 801 and 802 is effectively reduced. Therefore, with the physical quantity sensor 1, noise interference to the S1 and S2 wires 801 and 802 is reduced. It is possible to highly accurately detect the angular velocity ω.

Second Effect

Second, as explained above, in the physical quantity sensor 1, the side electrodes (803d, 806c, 807c, 808c, 809c, 810c, 811c, 812c, 813c, and 814c) included in the first wires are arranged on the side surfaces 631' and 632' corresponding to the outer edges (the first outer edges) 631 and 632 of the base 6. Consequently, the S1 and S2 wires 801 and 802 and the side surface electrodes can be separated from each other. Therefore, noise interference from the first wires to the S1 and S2 wires 801 and 802 is reduced. It is possible to highly accurately detect the angular velocity ω. In particular, in this embodiment, since the side surface electrodes 806c, 807c, 808c, and 809c of the digital signal wires are arranged on the opposite side of the S1 and S2 internal terminals 801a and 802a, the side surface electrodes 806c, 807c, 808c, and 809c and the S1 and S2 wires 801 and 802 are more largely separated from each other. Therefore, the effect explained above is more conspicuous. The physical quantity sensor 1 can more highly accurately detect the angular velocity ω.

Third Effect

Third, as explained above, in the physical quantity sensor 1, on the bottom surface of the base 6, the CLK external terminal 806b, the DO external terminal 808b, the VDD1 external terminal 810b, the VDD2 external terminal 814b, the DRY external terminal 812b, the D1 external terminal 807b, the CS external terminal 809b, the TEST1 external terminal 811b, and the TEST2 external terminal 813b are arranged along the outer edges (the first outer edges) 631 and 632. By adopting such arrangement of the external terminals, it is possible to separate the S1 and S2 wires 801 and 802 and the external terminals 806b to 814b as large as possible while maintaining a package size. Therefore, noise interference from the other wires (in particular, the side surface electrodes) to the S1 and S2 wires 801 and 802 is reduced. It is possible to highly accurately detect the angular velocity ω.

In particular, in this embodiment, since the external terminals 806b, 807b, 808b, and 809b of the CLK wire 806, the DI wire 807, the DO wire 808, and the CS wire 809, which transmit digital signals, are arranged on the opposite side of the S1 and S2 internal terminals 801a and 802a of the outer edges 631 and 632, the external terminals 806b, 807b, 808b, and 809b and the S1 and S2 wires 801 and 802 are more largely separated from each other. Therefore, the effect explained above is more conspicuous. The physical quantity sensor 1 can more highly accurately detects the angular velocity ω.

Fourth Effect

Fourth, as explained above, in the physical quantity sensor 1, the GND wire 803 (the GND internal terminal 803a') is arranged between the S1 wire 801 and the CLK wire 806, the DO wire 808, the VDD1 wire 810, the VDD2 wire 814, and the DRY wire 812. Similarly, the GND wire 803 (the GND internal terminal 803a") is arranged between the S2 wire 802 and the DS wire 804, the DI wire 807, the CS wire 809, the TEST1 wire 811, and the TEST2 wire 813. Therefore, the GND wires 803 function as shield layers for blocking noise and reduce mixing of noise from the CLK wire 806, the DO wire 808, the VDD1 wire 810, the VDD2 wire 814, and the DRY wire 812 in the S1 and S2 wires 801 and 802 and mixing of noise from the DS wire 804, the DI wire 807, the CS wire 809, the TEST1 wire 811, and the TEST2 wire 813 in the S1 and S2 wires 801 and 802. Therefore, noise interference from the other wires to the S1 and S2 wires 801 and 802 is reduced. It is possible to highly accurately detect the angular velocity ω.

In particular, as in this embodiment, by arranging the GND wire 803 between the CLK wire 806, the DI wire 807, the DO wire 808, and the CS wire 809 and the S1 and S2 wires 801 and 802, the effect explained above is more conspicuous because of a reason same as the reason explained above. It is possible to more highly accurately detect the angular velocity ω.

Note that, in this embodiment, the GND wires 803 are respectively arranged between the S1 wire 801 and the wires 806, 808, 810, 814, and 812 and between the S2 wire 802 and the wires 804, 807, 809, 811, and 813. However, the same effects can be displayed when fixed potential wires having fixed potential are arranged instead of the GND wires 803. For example, power supply wires can be used as the fixed potential wires.

Fifth Effect

Fifth, an extending direction of the conductive wires 824, 825, 830, and 831 connected to the CLK internal terminal 806a, the DO internal terminal 808a, the DI internal terminal 807a, and the CS internal terminal 809a functioning as the digital signal wires and an extending direction of the conductive wires 821 and 822 connected to the S1 and S2 internal terminals 801a and 802a functioning as the internal terminals of the detection signal wires are orthogonal to each other. More specifically, digital signals flow to the conductive wires 824, 825, 830, and 831, whereby a magnetic field is concentrically generated centering on the axes of the conductive wires.

Other conductive wires parallel to the conductive wires 824, 825, 830, and 831 in plan view (hereinafter referred to as parallel conductive wires) are explained. The parallel conductive wires are substantially linear in plan view but are not completely linear and form a part of a closed loop in sectional view. A vector of the magnetic field generated around the parallel conductive wires has a component orthogonal to the surface of the closed loop. Therefore, an induction current flows to the parallel conductive wires. As a result, an electric noise signal is superimposed on the parallel conductive wires.

The conductive wires 821 and 822 orthogonal to the conductive wires 824, 825, 830, and 831 in plan view are explained. The conductive wires 821 and 822 are substantially linear in plan view but is not completely linear and form a part of a closed loop in sectional view. However, a vector of the magnetic field generated around the conductive wires 821 and 822 is substantially parallel to the surface of the closed loop. Therefore, an induction current flowing to the conductive wires 821 and 822 can be suppressed. As a result, digital signals flow to the conductive wires 824, 825, 830, and 831. Consequently, it is possible to suppress noise signals that occur in the conductive wires 821 and 822.

Note that, in the example explained above, the extending direction of the conductive wires 824, 825, 830, and 831 and the extending direction of the conductive wires 821 and 822 are orthogonal to each other. However, even when the extending directions cross each other, it is possible to suppress electric noise signals from being superimposed on the conductive wires 821 and 822.

As explained above, in the physical quantity sensor 1, the CLK internal terminal 806a, the DO internal terminal 808a, the VDD1 internal terminal 810a, the VDD2 internal terminal 814a, the DRY internal terminal 812a, the DS internal terminal 804a, the DI internal terminal 807a, the CS internal terminal 809a, the TEST1 internal terminal 811a, and the TEST2 internal terminal 813a and the IC 10 are connected by the conductive wires 824 to 835. The S1 and S2 internal terminals 801a and 802a and the IC 10 are connected by the conductive wires 821 and 822. In the physical quantity sensor 1, an extending direction of the conductive wires 824 to 835 and an extending direction of the conductive wires 821 and 822 cross each other in the plan view of the base 6. Specifically, whereas the conductive wires 824 to 835 extend in the minor axis direction of the base 6, the conductive wires 821 and 822 extend in the major axis direction of the base 6. That is, the extending direction of the conductive wires 824 to 835 and the extending direction of the conductive wires 821 and 822 are orthogonal to each other. By adopting such arrangement, it is possible to separate the conductive wires 821 and 822 and the conductive wires 824 to 835 as large as possible while maintaining a package size. Therefore, noise interference from the other wires to the S1 and S2 wires 801 and 802 is reduced. It is possible to highly accurately detect the angular velocity ω.

Sixth Effect

Sixth, as explained above, in the physical quantity sensor 1, the third substrate 6C and the fifth substrate 6E are arranged to sandwich the fourth substrate 6D on which the internal terminals 801a to 814a are formed. The GND wires 803 are respectively provided on the third and fifth substrates 6C and 6E. Consequently, the wires 801, 802, and 804 to 814 arranged on the fourth substrate 6D are sandwiched by the GND wires 803. As explained above, the GND wires 803 function as the shield layers for reducing mixing of noise in the S1 and S2 wires 801 and 802. Therefore, by adopting such a configuration, noise interference from the other wires to the S1 and S2 wires 801 and 802 is reduced. It is possible to highly accurately detect the angular velocity ω.

Seventh Effect

Seventh, in the physical quantity sensor 1, the bonding lead 93 is arranged to overlap the S1 wire 801 (the S1 internal terminal 801a). By arranging the bonding lead 93, which is electrically connected to the S1 wire 801, near the S1 wire 801 in this way, it is possible to relatively separate the other bonding leads 92 and 94, which are not electrically connected to the S1 wire 801, from the S1 wire 801. Therefore, it is possible to reduce noise interference from the bonding leads 92 and 94 to the S1 wire 801.

Similarly, the bonding lead 94 is arranged to overlap the S2 wire 802 (the S2 internal terminal 802a). By arranging the bonding lead 94, which is electrically connected to the S2 wire 802, near the S2 wire 802 in this way, it is possible to relatively separate the other bonding leads 92 and 93, which are not electrically connected to the S2 wire 802, from the S2 wire 802. Therefore, it is possible to reduce noise interference from the bonding leads 92 and 93 to the S2 wire 802.

The effects that can be displayed by the physical quantity sensor 1 are explained above.

A simulation result for supporting the effects is shown in Table 1 below. "This embodiment" in Table 1 corresponds to the physical quantity sensor in this embodiment and indicates the magnitude of capacity coupling between wires obtained when the S1 internal terminal 801a and the S2 internal terminal 802a are arranged along the short side 613c of the fourth substrate 6D. On the other hand, "related art" in Table 1 corresponds to the physical quantity sensor in the past and indicates the magnitude of capacity coupling between wires obtained when, for example, the S1 internal terminal 801a is arranged along the outer edge 631 (the long side 613a) of the fourth substrate 6D and the S2 internal terminal 802a is arranged along the outer edge 632 (the long side 613b).

TABLE 1

|  | Related art | | This embodiment | |
| --- | --- | --- | --- | --- |
|  | S1 | S2 | S1 | S2 |
| First terminal (Terminal in the position of CLK) | 0.02 | 0.03 | 0.02 | 0.02 |
| Second terminal (Terminal in the position of DO) | 0.03 | 0.09 | 0.02 | 0.11 |
| Third terminal (Terminal in the position of DI) | 0.03 | 0.02 | 0.02 | 0.03 |
| Fourth terminal (Terminal in the position of CS) | 0.13 | 5.33 | 0.13 | 2.18 |
| Fifth terminal (Terminal in the position of DG) | 7.60 | 4.56 | 5.52 | 4.81 |
| Sixth terminal (Terminal in the position of DRY) | 0.07 | 0.03 | 0.07 | 0.02 |
| Seventh terminal (Terminal in the position of DS) | 0.02 | 0.03 | 0.03 | 0.03 |
| Eighth terminal (Terminal in the position of GND) | 428.69 | 425.98 | 406.27 | 405.67 |
| Ninth terminal (Terminal in the position of VDD1) | 0.03 | 12.11 | 0.04 | 2.63 |
| Tenth terminal (Terminal in the position of TEST1) | 0.03 | 0.03 | 0.04 | 0.02 |
| Eleventh terminal (Terminal in the position of VDD2) | 11.35 | 0.04 | 2.68 | 0.03 |
| Twelfth terminal (Terminal in the position of TEST2) | 0.06 | 0.02 | 0.01 | 0.02 |
|  |  |  |  | [fF] |

As it is seen from Table 1, the capacity coupling between the S1 and S2 wires 801 and 802 and the other wires is smaller in the physical quantity sensor in this embodiment. In particular, the capacity coupling is conspicuously small between the S1 and S2 wires 801 and 802 and the CS wire, the VDD1 wire, and the VDD2 wire. Therefore, with the physical quantity sensor 1, noise interference from the other wires to the S1 and S2 wires 801 and 802 is reduced. It is possible to more accurately detect the angular velocity ω.

Second Embodiment

Figure 14:
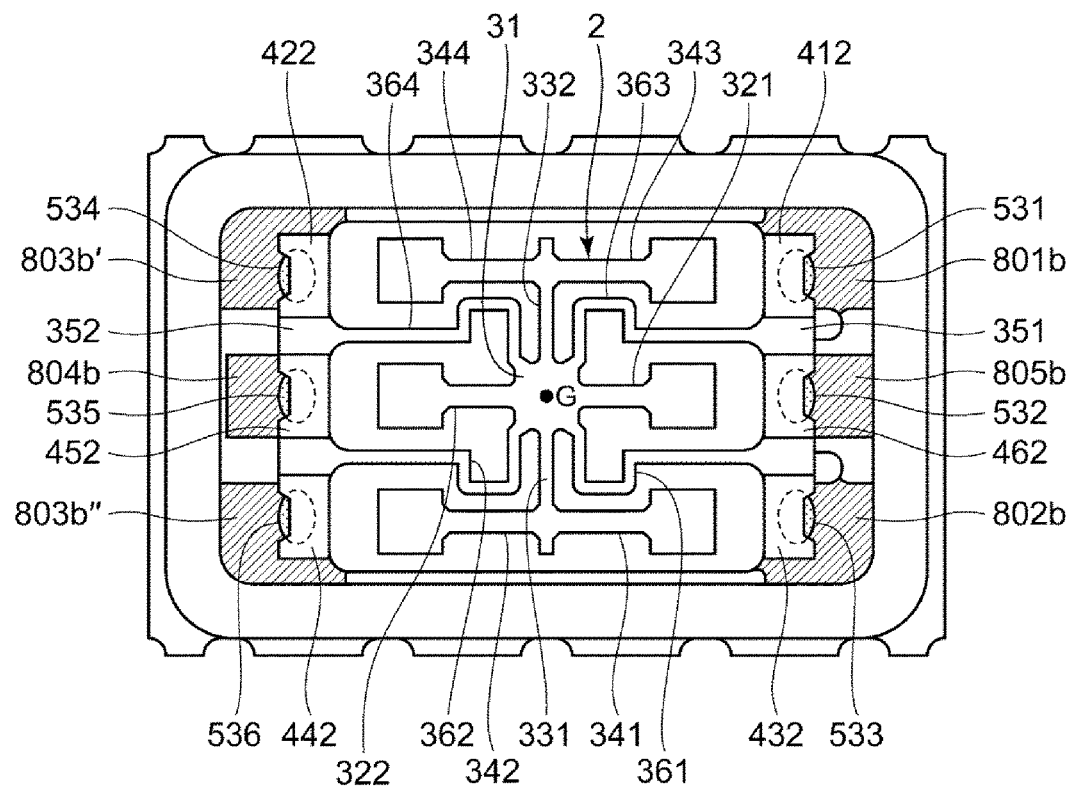
FIG. 14 is a plan view (a top view) of a physical quantity sensor according to a second embodiment of the invention.

FIG. 14 is a plan view (a top view) of a physical quantity sensor according to a second embodiment of the invention.

Differences of the physical quantity sensor in the second embodiment from the first embodiment are mainly explained below. Explanation of similarities is omitted.

The physical quantity sensor in the second embodiment is the same as the physical quantity sensor in the first embodiment except that the configuration of a gyro element is different and, therefore, a supporting substrate is omitted. Note that, in FIG. 14, components same as the components in the first embodiment are denoted by the same reference numerals and signs.

As shown in FIG. 14, in the physical quantity sensor 1 in this embodiment, compared with the physical quantity sensor in first embodiment, the supporting substrate 9 is omitted.

Gyro Element

In the gyro element 2 in this embodiment, compared with the gyro element 2 in the first embodiment, first and second supporting sections 351 and 352 and first, second, third, and fourth beams 361, 362, 363, and 364 are added.

The first and second supporting sections 351 and 352 are arranged to be opposed to each other in the Y-axis direction via the base section 31. The first and second supporting sections 351 and 352 are arranged to extend in the X-axis direction. The base section 31 is supported on the first supporting section 351 by the first and third beams 361 and 363 and supported on the second supporting section 352 by the second and fourth beams 362 and 364.

The first beam 361 passes between the first detection arm 321 and the first driving arm 341 and couples the base section 31 and the first supporting section 351. The second beam 362 passes between the second detection arm 322 and the second driving arm 342 and couples the base section 31 and the second supporting section 352. The third beam 363 passes between the first detection arm 321 and the third driving arm 343 and couples the base section 31 and the first supporting section 351. The fourth beam 364 passes between the second detection arm 322 and the fourth driving arm 344 and couples the base section 31 and the second supporting section 352. The beams 361, 362, 363, and 364 are arranged point-symmetrically with respect to the center of gravity G. The beams 361, 362, 363, and 364 include meandering sections (S-shaped sections) extending along the Y-axis direction while curving back and forth along the X-axis direction. The beams 361, 362, 363, and 364 have elasticity in the X-axis direction and the Y-axis direction. Consequently, it is possible to absorb a shock with the beams 361, 362, 363, and 364 and reduce or suppress detection noise due to the shock.

In the gyro element 2, the driving ground terminal 462 is arranged in the center of the first supporting section 351. The first detection signal terminal 412 is arranged at the end in the −X-axis direction. The second detection signal terminal 432 is arranged at the end in the +X-axis direction. The driving single terminal 452 is arranged in the center of the second supporting section 352. The first detection ground terminal 422 is arranged at the end in the −X-axis direction. The second detection ground terminal 442 is arranged at the end in the +X-axis direction.

In this embodiment, the gyro element 2 is joined to the base 6 by six conductive bonding materials 531 and 536. The conductive bonding material 531 is provided in contact with the first detection signal terminal 412 and the S1 connection terminal 801*b* and electrically connects the terminals. The conductive bonding material 532 is provided in contact with the driving ground terminal 462 and the DG connection terminal 805*b* and electrically connects the terminals. The conductive bonding material 533 is provided in contact with the second detection signal terminal 432 and the S2 connection terminal 802*b* and electrically connects the terminals. The conductive bonding material 534 is provided in contact with the first detection ground terminal 422 and the GND connection terminal 803*b*' and electrically connects the terminals. The conductive bonding material 535 is provided in contact with the driving signal terminal 542 and the DS connection terminal 804*b* and electrically connects the terminals. The conductive bonding material 556 is provided in contact with the second detection ground terminal 442 and the GND connection terminal 803*b*" and electrically connects the terminals. Consequently, the gyro element 2 is fixed to and electrically connected to the base 6.

2. Electronic Device

An electronic device applied with the physical quantity sensor 1 is explained in detail with reference to FIGS. 15 to 17.

Figure 15:
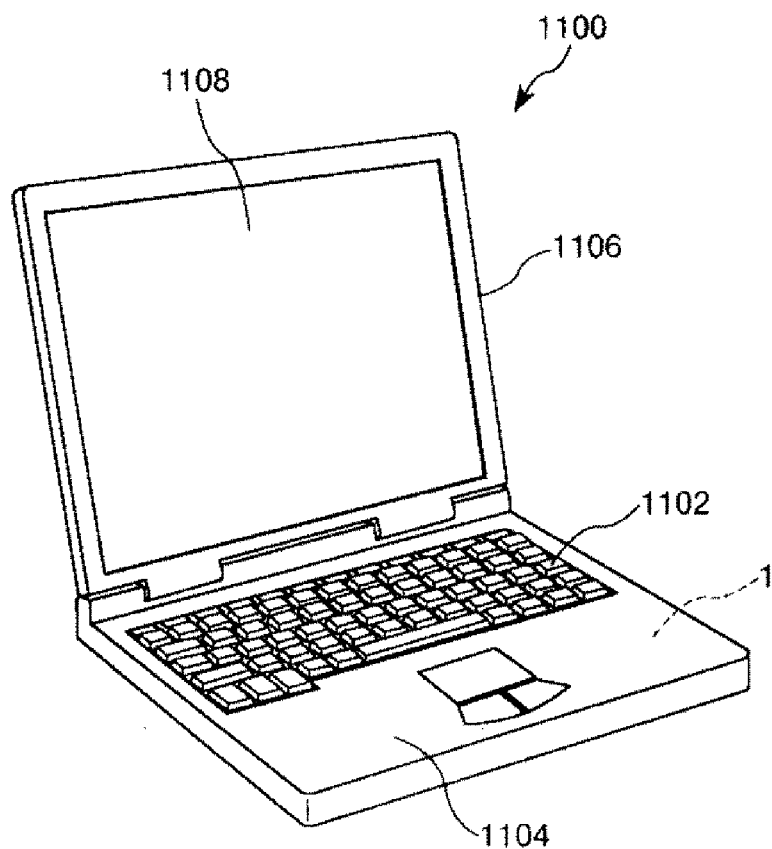
FIG. 15 is a perspective view showing the configuration of a personal computer of a mobile type (or a notebook type) applied with an electronic device including the physical quantity sensor according to the first or second embodiment of the invention.

FIG. 15 is a perspective view showing the configuration of a personal computer of a mobile type (or a notebook type) applied with an electronic device including the physical quantity sensor according to the first or second embodiment of the invention. In the figure, a personal computer 1100 is configured by a main body section 1104 including a keyboard 1102 and a display unit 1106 including a display section 1108. The display unit 1106 is turnably supported with respect to the main body section 1104 via a hinge structure section. The personal computer 1100 incorporates the physical quantity sensor 1 that functions as angular velocity detecting means.

Figure 16:
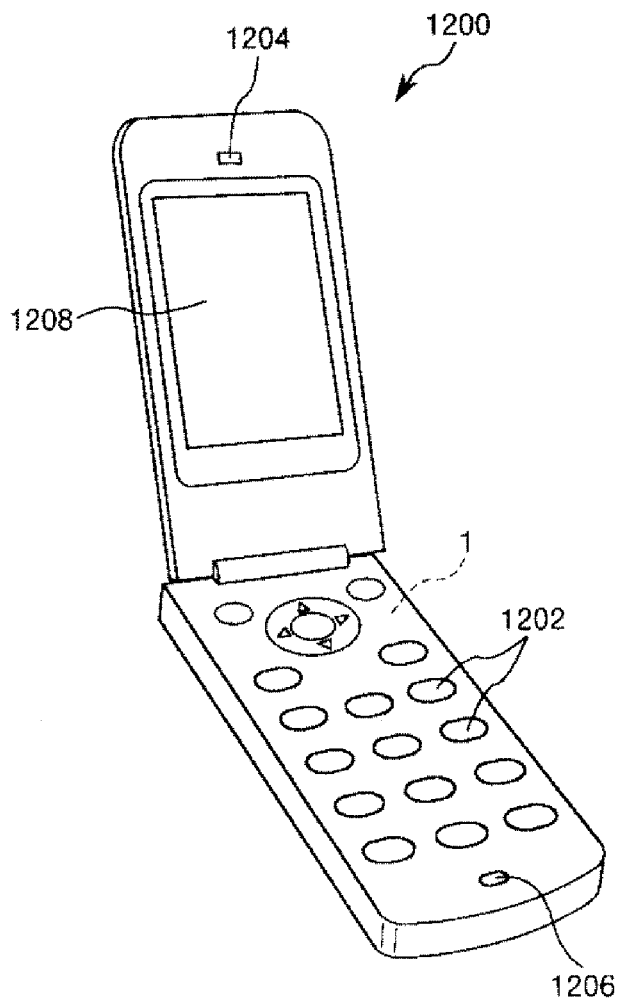
FIG. 16 is a perspective view showing the configuration of a cellular phone (including a PHS) applied with the electronic device including the physical quantity sensor according to the first or second embodiment.

FIG. 16 is a perspective view showing the configuration of a cellular phone (including a PHS) applied with the electronic device including the physical quantity sensor according to the first or second embodiment of the invention. In the figure, a cellular phone 1200 includes a plurality of operation buttons 1202, an earpiece 1204, and a mouthpiece 1206. A display section 1208 is arranged between the operation buttons 1202 and the earpiece 1204. The cellular phone 1200 incorporates the physical quantity sensor 1 that functions as angular velocity detecting means.

Figure 17:
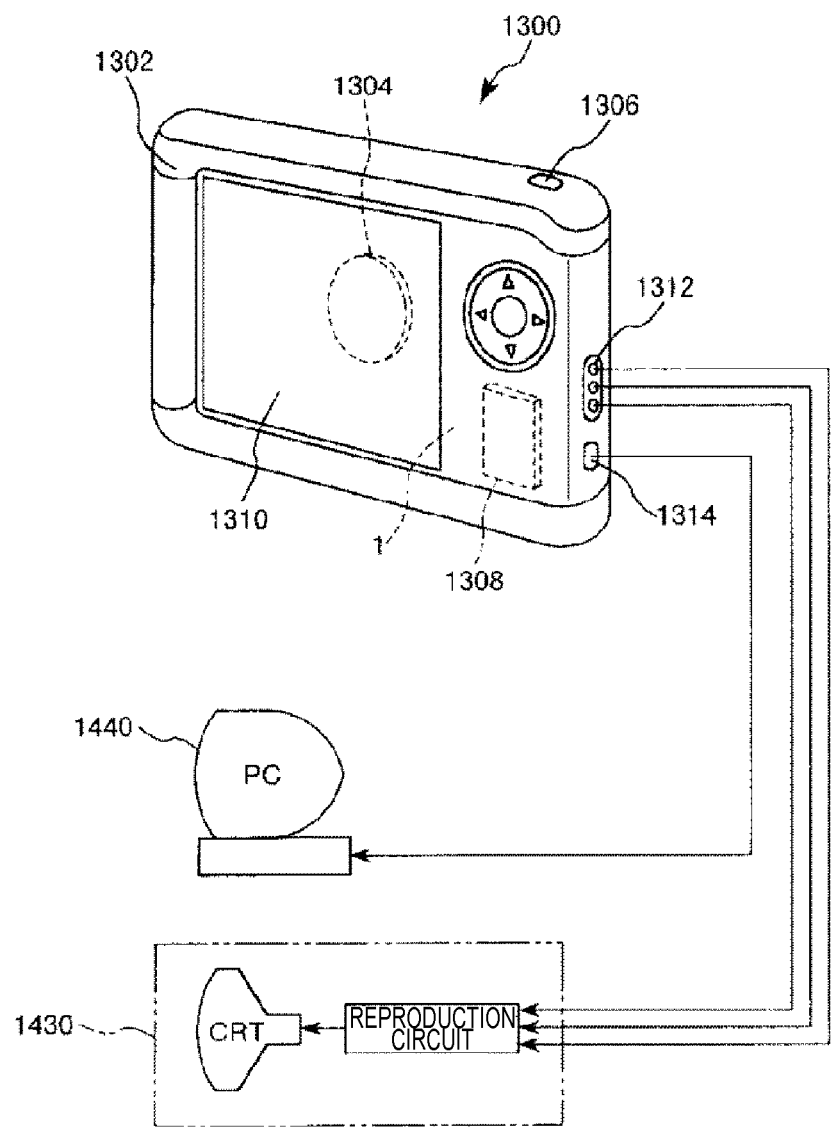
FIG. 17 is a perspective view showing the configuration of a digital still camera applied with the electronic component including the physical quantity sensor according to the first or second embodiment.

FIG. 17 is a perspective view showing the configuration of a digital still camera applied with the electronic device including the physical quantity sensor according to the first or second embodiment of the invention. Note that, in the figure, connection to external apparatuses is simply shown. Whereas a normal camera exposes a silver halide photograph film to an optical image of an object, a digital still camera 1300 photoelectrically converts an optical image of an object with an image pickup device such as a CCD (Chare Coupled Device) and generates an image pickup signal (an image signal).

A display section 1310 is provided on the rear surface of a case (a body) 1302 in the digital still camera 1300. The display section 1310 performs display on the basis of the image pickup signal generated by the CCD. The display section 1310 functions as a finder that displays the object as an electronic image.

A light receiving unit 1304 including an optical lens (an image pickup optical system) and a CCD is provided on the front surface side (the rear surface side in the figure) of the case 1302.

When a photographer checks an object image displayed on the display section 1310 and depresses a shutter button 1306, an image pickup signal of the CCD at that point is transferred to and stored in a memory 1308.

In the digital still camera 1300, a video signal output terminal 1312 and an input and output terminal 1314 for data communication are provided on a side surface of the case 1302. As shown in the figure, a television monitor 1430 is connected to the video signal output terminal 1312 according to necessity. A personal computer 1440 is connected to the input and output terminal 1314 for data communication according to necessity. Further, the image pickup signal stored in the memory 1308 is output to the television monitor 1430 and the personal computer 1440 by predetermined operation.

The digital still camera 1300 incorporates the physical quantity sensor 1 that functions as angular velocity detecting means.

Note that, the electronic device including the physical quantity sensor according to the first or second embodiment of the invention can be applied to, besides the personal computer (the mobile personal computer) shown in FIG. 15, the cellular phone shown in FIG. 16, and the digital still camera shown in FIG. 17, for example, an inkjet discharge apparatus (e.g., an inkjet printer), a laptop personal computer, a television, a video camera, a video tape recorder, a car navigation apparatus, a pager, an electronic organizer (including an electronic organizer with a communication function), an electronic dictionary, an electronic calculator, an electronic game machine, a word processor, a work station, a videophone, a television monitor for crime prevention, electronic binoculars, a POS terminal, medical equipment (e.g., an electronic thermometer, a blood pressure manometer, a blood sugar meter, an electrocardiogram measuring apparatus, an ultrasonic diagnostic apparatus, and an electronic endoscope), a fish finder, measurement instruments, meters (e.g., meters of a vehicle, an airplane, and a ship), and a flight simulator.

3. Moving Object

A moving object applied with the physical quantity sensor shown in FIG. 1 is explained in detail with reference to FIG. 18.

Figure 18:
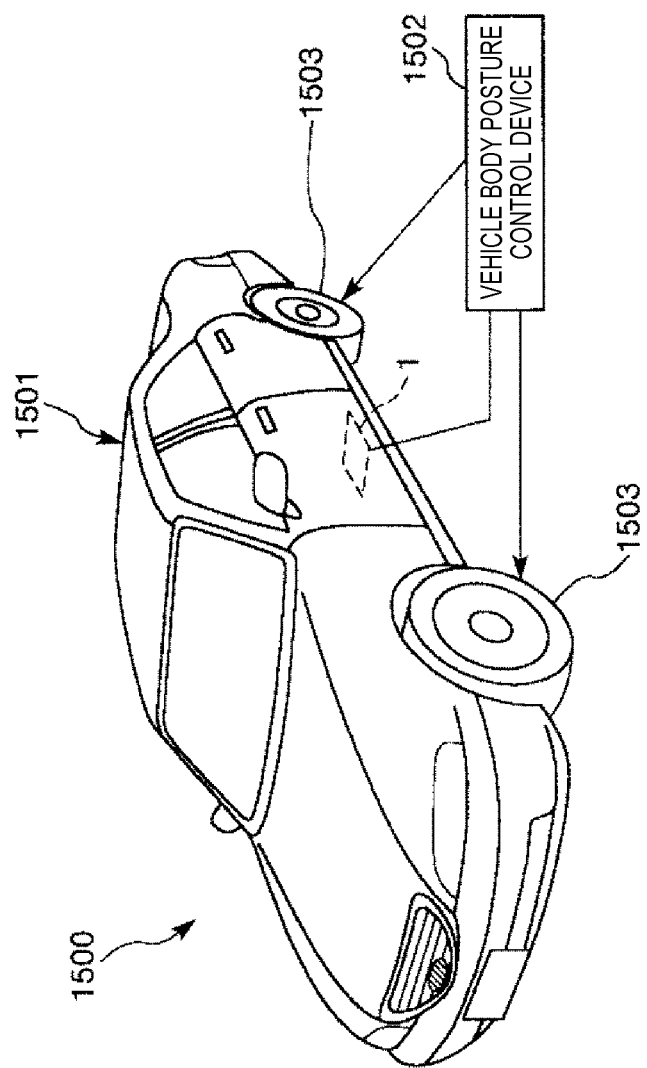
FIG. 18 is a perspective view showing the configuration of an automobile applied with a moving object including the physical quantity sensor according to the first embodiment.

FIG. 18 is a perspective view showing the configuration of an automobile applied with a moving object including the physical quantity sensor according to the first embodiment of the invention. An automobile 1500 incorporates the physical quantity sensor 1 that functions as angular velocity detecting means. The posture of a vehicle body 1501 can be detected by the physical quantity sensor 1. A signal from the physical quantity sensor 1 is supplied to a vehicle body posture control device 1502. The vehicle body posture control device 1502 can detect the posture of the vehicle body 1501 on the basis of the signal, control hardness of a suspension according to a detection result, and control brakes of respective wheels 1503. Besides, such posture control can be used in a bipedal walking robot and a radio controlled helicopter. As explained above, the physical quantity sensor 1 is incorporated in realizing the posture control of the various moving objects.

The package, the electronic component mounted package, the physical quantity sensor, the electronic device, and the moving object according to the embodiments of the invention are explained above. However, the invention is not limited by the embodiments. The components of sections can be replaced with any components having the same functions. Any other components may be added to the invention. The invention may be a combination of any two or more configurations (features) in the embodiments.

The entire disclosure of Japanese Patent Application No. 2013-242556, filed Nov. 25, 2013 is expressly incorporated by reference herein.

What is claimed is:

1. A physical quantity sensor comprising:
a rectangular base having first and second sides;
an electronic component mounted on the base, the electronic component providing a digital signal;
a physical quantity detection element mounted on the base, the physical quantity detection element providing a detection signal; and
a plurality of wires arranged on the base, the plurality of wires including:
a plurality of first wires having a plurality of first internal terminals and including a digital signal wire having a digital signal terminal, the plurality of first wires being communicably connected to the electronic component, the digital signal wire transmitting the digital signal from the electronic component; and
a plurality of second wires having a plurality of second internal terminals and including a detection signal wire having a detection signal terminal, the plurality of second wires being communicably connected to the physical quantity detection element,
wherein the plurality of first internal terminals are arranged along a first axis that is located along the first side of the base,
the plurality of the second internal terminals are arranged along a second axis that is located along the second side of the base and that is perpendicular to the first axis, and
a middle one of the plurality of first terminals is spaced apart from the second axis by a first distance, the digital signal terminal is spaced apart from the second axis by a second distance, and the first distance is less than the second distance.

2. The physical quantity sensor according to claim 1, wherein at least one of a ground wire and a fixed potential wire having a fixed potential is arranged between the digital signal terminal and the detection signal terminal and is spaced apart from the digital signal terminal and the detection signal terminal.

3. The physical quantity sensor according to claim 1, wherein the electronic component has a driving circuit configured to drive the physical quantity detection element.

4. The physical quantity sensor according to claim 1, wherein the physical quantity detection element is a gyro sensor.

5. An electronic device comprising:
the physical quantity sensor according to claim 1; and
a housing having a display,
wherein when the housing moves, the physical quantity sensor is configured to detect a physical quantity of the housing.

6. A moving object comprising:
the physical quantity sensor according to claim 1; and
a movable body,
wherein when the movable body moves, the physical quantity sensor is configured to detect a physical quantity of the movable body.

7. A physical quantity sensor comprising:

a rectangular base having first and second sides;

an electronic component mounted on the base, the electronic component providing a digital signal;

a physical quantity detection element mounted on the base, the physical quantity detection element providing a detection signal; and a plurality of wires arranged on the base, the plurality of wires including:

- a plurality of first wires having a plurality of first internal terminals and including a digital signal wire having a digital signal terminal, the plurality of first wires being communicably connected to the electronic component, the digital signal wire transmitting the digital signal from the electric component; and
- a plurality of second wires having a plurality of second internal terminals and including a detection signal wire having a detection signal terminal, the plurality of second wires being communicably connected to the physical quantity detection element, wherein at least one of a ground wire and a fixed potential wire having a fixed potential is arranged between the digital signal wire and the detection signal wire and is spaced apart from the digital signal wire and the detection signal wire.

8. The physical quantity sensor according to claim 7, wherein one end of the first side of the base is physically connected to one end of the second side of the base, the plurality of first internal terminals are arranged along a first axis that is parallel to an outer edge of the first side of the base, and the plurality of second internal terminals are arranged along a second axis that is parallel to an outer edge of the second side of the base.

9. The physical quantity sensor according to claim 8, wherein the digital signal terminal is located closer to the other end of the first side of the base than the one end of the first side of the base.

10. The physical quantity sensor according to claim 7, wherein the electronic component has a driving circuit configured to the drive the physical quantity detection element.

11. The physical quantity sensor according to claim 7, wherein the physical quantity detection element is a gyro sensor.

12. An electronic device comprising:

the physical quantity sensor according to claim 7; and a housing having a display, wherein when the housing moves, the physical quantity sensor is configured to detect a physical quantity of the housing.

13. A moving object comprising:

the physical quantity sensor according to claim 7; and a movable body, wherein when the movable body moves, the physical quantity sensor is configured to detect a physical quantity of the movable body.

14. A package for a physical quantity sensor, the package comprising:

a rectangular base on which an electronic component and a physical quantity detection element are mountable, the base having first and second sides, the electronic component providing a digital signal, the physical quantity detection element providing a detection signal; and a plurality of wires arranged on the base, the plurality of wires include:

- a plurality of first wires having a plurality of first internal terminals and including a digital signal wire having a digital signal terminal, the plurality of first wires being selectively connectable to the electronic component, the digital signal wire selectively transmitting the digital signal from the electronic component; and
- a plurality of second wires having a plurality of second internal terminals and including a detection signal wire having a detection signal terminal, the plurality of second wires being selectively connectable to the physical quantity detection element, wherein the plurality of first internal terminals are arranged along a first axis that is located along the first side of the base, the plurality of second internal terminals are arranged along a second axis that is located along the second side of the base and that is perpendicular to the first axis, and a middle one of the plurality of first terminals is spaced apart from the second axis by a first distance, the digital signal terminal is spaced apart from the second axis by a second distance, and the first distance is less than the second distance.

15. The package according to claim 14, wherein at least one of a ground wire and a fixed potential wire having a fixed potential is arranged between the digital signal terminal and the detection signal terminal and is spaced apart from the digital signal terminal and the detection signal terminal.

* * * * *